(12) United States Patent
Obradovic et al.

(10) Patent No.: US 9,647,098 B2
(45) Date of Patent: May 9, 2017

(54) THERMIONICALLY-OVERDRIVEN TUNNEL FETS AND METHODS OF FABRICATING THE SAME

(71) Applicant: Samsung Electronics Co., Ltd., Gyeonggi-do (KR)

(72) Inventors: Borna Obradovic, Leander, TX (US); Robert C. Bowen, Austin, TX (US); Dharmendar Reddy Palle, Austin, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/593,636

(22) Filed: Jan. 9, 2015

(65) Prior Publication Data

US 2016/0020305 A1    Jan. 21, 2016

Related U.S. Application Data

(60) Provisional application No. 62/027,195, filed on Jul. 21, 2014.

(51) Int. Cl.
*H01L 29/66*    (2006.01)
*H01L 29/16*    (2006.01)
(Continued)

(52) U.S. Cl.
CPC .... *H01L 29/66977* (2013.01); *H01L 29/0673* (2013.01); *H01L 29/16* (2013.01);
(Continued)

(58) Field of Classification Search
CPC ......... H01L 29/42388; H01L 29/42396; H01L 29/42324; H01L 29/76; H01L 29/78;
(Continued)

(56) References Cited

U.S. PATENT DOCUMENTS 5,430,310 A    7/1995    Shibasaki et al.
5,461,250 A    10/1995    Burghartz et al.
(Continued)

FOREIGN PATENT DOCUMENTS

CN    102194884 (A)    9/2011
EP    1 188 188 B1    8/2005
(Continued)

OTHER PUBLICATIONS

Cai et al. "III-Nitride metal-insulator-semiconductior heterojunction field-effect transistors using sputtered AION thin film", Applied Physics Letters, vol. 86, p. 032109 (2005).
(Continued)

*Primary Examiner* — Natalia Gondarenko
(74) *Attorney, Agent, or Firm* — Myers Bigel, P.A.

(57) ABSTRACT

A field effect transistor (FET) includes a nanosheet stack having first and second stacked semiconductor channel layers. The first channel layer defines a channel region of a tunnel FET, and the second channel layer defines a channel region of a thermionic FET. Source and drain regions are provided on opposite sides of the nanosheet stack such that the first and second channel layers extend therebetween. A first portion of the source region adjacent the first channel layer and a second portion of the source region adjacent the second channel layer have opposite semiconductor conductivity types. Related fabrication and operating methods are also discussed.

24 Claims, 11 Drawing Sheets

(51) Int. Cl.
  *H01L 29/20* (2006.01)
  *H01L 29/10* (2006.01)
  *H01L 29/161* (2006.01)
  *H01L 29/739* (2006.01)
  *H01L 29/06* (2006.01)
  *H01L 21/311* (2006.01)
  *H01L 21/22* (2006.01)
  *H01L 29/78* (2006.01)

(52) U.S. Cl.
  CPC ............ *H01L 29/161* (2013.01); *H01L 29/20* (2013.01); *H01L 29/7391* (2013.01)

(58) Field of Classification Search
  CPC ... H01L 29/788; H01L 29/165; H01L 29/205; H01L 21/76216; H01L 21/76227; H01L 21/228; H01L 21/02532; H01L 21/2652; H01L 21/823412; H01L 21/22; H01L 21/225; H01L 21/2256; H01L 21/2253; H01L 21/28176; H01L 21/84; H01L 21/2818; H01L 21/32133; H01L 21/31105; H01L 21/311; H01L 21/3213; H01L 21/823807; H01L 21/8234; H01L 21/8238; H01L 21/823821; H01L 21/823814; H01L 29/0673; H01L 29/0878; H01L 29/4238; H01L 29/42364; H01L 29/42356; H01L 29/1054; H01L 29/10; H01L 29/16; H01L 29/161; H01L 29/20; H01L 29/49; H01L 29/66; H01L 29/7842; H01L 29/7883; H01L 29/66484; H01L 29/66522; H01L 29/66545; H01L 29/66977; H01L 29/66636; H01L 29/6659; H01L 29/66666; H01L 29/66795; H01L 29/66825; H01L 27/0924; H01L 27/092; H01L 27/088; H01L 27/0886; H01L 27/12; H01L 29/66477; H01L 29/78618; H01L 29/7834; H01L 29/785
  USPC .... 438/448; 257/314, 315, 105, 30, 39, 104, 257/E29.024, E29.168; 365/185.12
  See application file for complete search history.

(56) References Cited

U.S. PATENT DOCUMENTS

| | | | |
|---|---|---|---|
| 6,603,156 B2 | 8/2003 | Rim | |
| 7,029,964 B2 | 4/2006 | Cheng et al. | |
| 7,112,832 B2 | 9/2006 | Orlowski et al. | |
| 7,262,465 B2 | 8/2007 | Hatada et al. | |
| 7,276,723 B2 | 10/2007 | Fathimulla et al. | |
| 7,402,483 B2 | 7/2008 | Yun et al. | |
| 7,416,957 B2 | 8/2008 | Ponomarev | |
| 7,427,788 B2 | 9/2008 | Li et al. | |
| 7,476,930 B2 | 1/2009 | Allibert et al. | |
| 7,795,687 B2 | 9/2010 | Suk et al. | |
| 7,973,336 B2 | 7/2011 | Savage et al. | |
| 8,183,627 B2 | 5/2012 | Currie | |
| 8,183,667 B2 | 5/2012 | Park | |
| 8,236,626 B2 | 8/2012 | Dai et al. | |
| 8,247,806 B2 | 8/2012 | Chae et al. | |
| 8,293,608 B2 | 10/2012 | Orlowski et al. | |
| 8,309,986 B2 | 11/2012 | Lochtefeld | |
| 8,329,541 B2 | 12/2012 | Ye et al. | |
| 8,362,604 B2 | 1/2013 | Ionescu | |
| 8,384,122 B1* | 2/2013 | Hu | H01L 29/7391 257/104 |
| 8,404,545 B2 | 3/2013 | Vandenberghe et al. | |
| 8,421,165 B2 | 4/2013 | Loh et al. | |
| 8,436,422 B2 | 5/2013 | Loh et al. | |
| 8,440,517 B2 | 5/2013 | Lin et al. | |
| 8,530,884 B2 | 9/2013 | Datta et al. | |
| 8,686,402 B2 | 4/2014 | Goel et al. | |
| 8,754,470 B1 | 6/2014 | Chuang et al. | |
| 8,766,353 B2 | 7/2014 | Doris et al. | |
| 8,768,271 B1 | 7/2014 | Then et al. | |
| 8,809,987 B2 | 8/2014 | Chen et al. | |
| 8,816,326 B2 | 8/2014 | Yin et al. | |
| 8,937,299 B2 | 1/2015 | Basu et al. | |
| 2001/0013621 A1* | 8/2001 | Nakazato | H01L 21/28273 257/314 |
| 2002/0109135 A1 | 8/2002 | Murota et al. | |
| 2008/0135949 A1 | 6/2008 | Lo et al. | |
| 2008/0224183 A1 | 9/2008 | Nawaz | |
| 2009/0008630 A1* | 1/2009 | Hurkx | B82Y 10/00 257/25 |
| 2009/0101975 A1* | 4/2009 | Holz | H01L 21/823418 257/347 |
| 2009/0212324 A1 | 8/2009 | Tamai et al. | |
| 2010/0038679 A1* | 2/2010 | Chan | H01L 29/66795 257/190 |
| 2012/0153352 A1 | 6/2012 | Dewey et al. | |
| 2012/0193679 A1 | 8/2012 | Chen et al. | |
| 2012/0223390 A1 | 9/2012 | Liang et al. | |
| 2012/0292665 A1 | 11/2012 | Marino et al. | |
| 2013/0093497 A1 | 4/2013 | Lee et al. | |
| 2013/0119395 A1 | 5/2013 | Bhuwalka et al. | |
| 2013/0181263 A1 | 7/2013 | Cai | |
| 2013/0200433 A1 | 8/2013 | Adam et al. | |
| 2014/0034962 A1 | 2/2014 | Curatola et al. | |
| 2014/0138744 A1 | 5/2014 | Kotlyar et al. | |
| 2014/0197459 A1 | 7/2014 | Kis et al. | |
| 2014/0203350 A1 | 7/2014 | Chuang et al. | |
| 2014/0346573 A1 | 11/2014 | Adam | |
| 2015/0179788 A1* | 6/2015 | Teramoto | H01L 29/7606 327/109 |
| 2015/0270340 A1* | 9/2015 | Frank | H01L 29/0673 257/347 |

FOREIGN PATENT DOCUMENTS

| | | | | |
|---|---|---|---|---|
| JP | WO 2014064737 A1 * | 5/2014 | ......... | H01L 29/7606 |
| WO | WO 2013/095346 A1 | 6/2013 | | |
| WO | WO 2013/095651 | 6/2013 | | |
| WO | WO 2013/101001 A1 | 7/2013 | | |
| WO | WO 2013/101172 A1 | 7/2013 | | |

OTHER PUBLICATIONS

Ionescu A.M. et al. "Tunnel field-effect transistors as energy-efficient electronic switches", *Nature*, vol. 479, No. 7373, pp. 329-337, Nov. 16, 2011.

Lu Y. et al. "Performance of AlGaSb/InAs TFETs With Gate Electric Field and Tunneling Direction Aligned", *Electron Device Letters*, vol. 33, No. 5, pp. 655-657, May 2012.

Moselund K.E. et al. "InAs-Si Nanowire Heterojunction Tunnel FETs", *Electron Device Letters*, vol. 33, No. 10, pp. 1453-1455, Oct. 2012.

Register L.F. et al. "Stepped Broken-Gap Heterobarrier Tunneling Field-Effect Transistor for Ultralow Power and High Speed", *Electron Device Letters*, vol. 32, No. 6, pp. 743-745, Jun. 2011.

* cited by examiner

THERMIONICALLY-OVERDRIVEN TUNNEL FETS AND METHODS OF FABRICATING THE SAME

CLAIM OF PRIORITY

This application claims priority from U.S. Provisional Patent Application No. 62/027,195 entitled "A Thermionically-Overdriven Tunnel FET" filed on Jul. 21, 2014, the disclosure of which is incorporated by reference herein in its entirety.

BACKGROUND

As supply voltage $V_{DD}$ is reduced with each successive technology node, thermionically-injected FETs (in which electrons or holes are injected into the channel by propagating over, rather than through, an energy barrier) may suffer from decreased gate overdrive $V_{OV}$ (the portion of the gate-source voltage in excess of the threshold voltage Vt). This may be attributed to a fundamental lower bound (60 mV/dec) on the sub-threshold slope SS of thermionically-injected FETs. The bounded sub-threshold slope SS may indicate that, at fixed leakage current levels, the threshold voltage Vt may not scale with supply voltage $V_{DD}$. The lack of scaling of the threshold voltage Vt can lead to reduced gate overdrive as supply voltage $V_{DD}$ is reduced, and an overall degradation in performance of the thermionically-injected FET. As such, thermionic FETs can provide improved performance for higher-power applications, but may be limited in low-power regimes by the fixed lower bound of the subthreshold slope SS.

In contrast with thermionic FETs, tunnel FETs or TFETs (in which electrons or holes are injected into the channel by propagating through, rather than over, an energy barrier) may not have a fixed lower bound on the sub-threshold slope SS. Since injection into the channel can be governed by tunneling rather than energy sampling from a Fermi-Dirac distribution, the sub-threshold drain current (Id)-gate voltage (Vg) curve can be relatively steeper than that of thermionic FETs. The threshold voltage Vt of the TFET devices can therefore be relatively lower than that of thermionic devices, for the same off-current Ioff. As a result, TFETs may offer improved low-supply voltage $V_{DD}$ performance as compared to thermionic FETs. However, higher-supply voltage $V_{DD}$ performance of TFETs may be more limited, as the tunneling nature of the source-channel injection can limit performance. In other words, tunnel FETs can provide improved performance for lower-frequency applications, but may not be overdriven to sufficient performance levels for higher-frequency applications.

SUMMARY

Embodiments of the present inventive concepts provide a hybrid or combined tunnel FET/thermionic FET device to satisfy both low-frequency and high-frequency requirements within a same footprint, and thus, without layout area penalty. Embodiments of the present inventive concepts further provide operating methods in which the supply voltage modes are partitioned into two operating modes: TFET (low-frequency) and thermionic FET (high-frequency), in which TFET mode allows lower supply voltages $V_{DD}$ for the low-frequency operation.

According to some embodiments of the inventive concepts, a field effect transistor (FET) includes a nanosheet stack having first and second stacked semiconductor channel layers. The first channel layer defines a channel region of a tunnel FET, and the second channel layer defines a channel region of a thermionic FET. Source and drain regions are provided on opposite sides of the nanosheet stack such that the first and second channel layers extend therebetween. A first portion of the source region adjacent the first channel layer and a second portion of the source region adjacent the second channel layer have opposite semiconductor conductivity or doping types.

In some embodiments, the nanosheet stack may further include respective gate layers on opposing surfaces of the first and second channel layers, and respective gate dielectric layers between the gate layers and the first and second channel layers.

In some embodiments, a threshold voltage of the tunnel FET may be less than a threshold voltage of the thermionic FET.

In some embodiments, the first and second channel layers may include different dopant concentrations and/or different thicknesses.

In some embodiments, a thickness of the first channel layer may be sufficient to prevent band-to-band tunneling therein at the drain region of the device (as BTBT may be necessary at the source region) at gate voltages greater than the threshold voltage of the thermionic FET.

In some embodiments, a thickness of the second channel layer may be greater than that of the first channel layer.

In some embodiments, the nanosheet stack may include a plurality of the first and second channel layers, and respective spacings between ones of the first channel layers may differ from respective spacings between ones of the second channel layers.

In some embodiments, respective doped extension regions may be provided at opposite ends of the first and second channel layers adjacent the source and drain regions. The doped extension regions may extend between the gate layers.

In some embodiments, respective dielectric suspension regions may separate ends of the gate layers from the source and drain regions adjacent thereto. The doped extension regions may laterally extend from the source and drain regions to the first and second channel layers between the gate layers and beyond the dielectric suspension regions.

In some embodiments, respective contacts may be provided on the source and drain regions. The contact on the source region may electrically connect the first and second portions thereof having the opposite semiconductor conductivity or doping types.

In some embodiments, the first and second channel layers may include different semiconductor materials or different compositions of a same semiconductor material.

In some embodiments, at least one of the first and second channel layers may include Group III-V semiconductor materials or Group IV semiconductor materials. The Group III-V semiconductor materials may include indium gallium arsenide (InGaAs), indium arsenide (InAs), indium antimonide (InSb), and/or indium gallium antimonide (InGaSb), and the Group IV semiconductor materials may include silicon (Si), germanium (Ge), and/or silicon germanium (SiGe).

In some embodiments, the first and second channel layers and the source and drain regions may be epitaxial layers.

In some embodiments, the nanosheet stack may be a heteroepitaxial stack including crystalline semiconductor first and second channel layers, crystalline semiconductor gate layers, and crystalline semiconductor or insulating gate dielectric layers. Respective interfaces between the first and second channel layers and the gate dielectric layers may be free of non-crystalline materials.

According to further embodiments of the inventive concepts, in a method of fabricating a field effect transistor (FET), a nanosheet stack including first and second stacked semiconductor channel layers is provided. The first channel layer defines a channel region of a tunnel FET, and the second channel layer defines a channel region of a thermionic FET. Source and drain regions are formed on opposite sides of the nanosheet stack such that the first and second channel layers extend therebetween. A first portion of the source region adjacent the first channel layer and a second portion of the source region adjacent the second channel layer have opposite semiconductor conductivity or doping types.

In some embodiments, in providing the nanosheet stack respective gate dielectric layers may be formed on opposing surfaces of the first and second channel layers, and gate layers may be formed on the gate dielectric layers on and between the first and second channel layers.

In some embodiments, in providing the nanosheet stack, the first and second channel layers may be formed to include different dopant concentrations and/or to different thicknesses such that a threshold voltage of the tunnel FET may be less than a threshold voltage of the thermionic FET.

In some embodiments, the first channel layer may be formed to a thickness sufficient to prevent band-to-band tunneling therein at the drain region at gate voltages greater than the threshold voltage of the thermionic FET.

In some embodiments, the second channel layer may be formed to a thickness greater than that of the first channel layer.

In some embodiments, in providing the nanosheet stack, a plurality of the first and second channel layers may be formed. Respective spacings between ones of the first channel layers may differ from respective spacings between ones of the second channel layers.

In some embodiments, respective doped extension regions may be formed at opposite ends of the first and second channel layers adjacent the source and drain regions and extending between the gate layers.

In some embodiments, respective dielectric suspension regions may be formed to separate ends of the gate layers from the source and drain regions adjacent thereto. The doped extension regions may laterally extend from the source and drain regions to the first and second channel layers between the gate layers and beyond the dielectric suspension regions.

In some embodiments, respective contacts may be formed on the source and drain regions. The contact on the source region may electrically connect the first and second portions thereof.

In some embodiments, the first and second channel layers and the source and drain regions may be epitaxial layers.

According to still further embodiments of the inventive concepts, in a method of operating a field-effect transistor (FET), a first supply voltage is applied to a gate electrode extending between first and second stacked semiconductor channel layers in a first operating mode. The first and second channel layers extend between a drain region and a source region including portions of opposite semiconductor conductivity or doping types, and the first supply voltage is sufficient to cause significant conduction in the first channel layer but insufficient to cause significant conduction in the second channel layer. A second supply voltage is applied to the gate electrode in a second operating mode. The second supply voltage is sufficient to cause significant conduction in the second channel layer that is substantially greater than the conduction in the first channel layer.

In some embodiments, the first channel layer may define a channel region of a tunnel FET, and the second channel layer may define a channel region of a thermionic FET having a threshold voltage greater than that of the tunnel FET.

In some embodiments, the respective threshold voltages may provide a substantially same off-state leakage for the tunnel FET and the thermionic FET in the first and second operating modes, respectively.

In some embodiments, a thickness of the first channel layer may be sufficient to prevent band-to-band tunneling therein at the drain region responsive to application of the second supply voltage to the gate electrode in the second operating mode.

According to yet further embodiments of the inventive concepts, a heterogeneous nanosheet FET includes a first sheet configured to operate in a tunneling mode, and a second sheet configured to operate in a thermionic mode. The first and second sheets are stacked in a direction normal to a film plane.

According to still yet further embodiments of the inventive concepts, a method of fabricating a heterogeneous nanosheet FET includes providing a first sheet configured to operate in a tunneling mode, and providing a second sheet configured to operate in a thermionic mode. The first and second sheets are stacked in a direction normal to a film plane.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the inventive concepts, and be protected by the accompanying claims.

DETAILED DESCRIPTION

Figure 1:
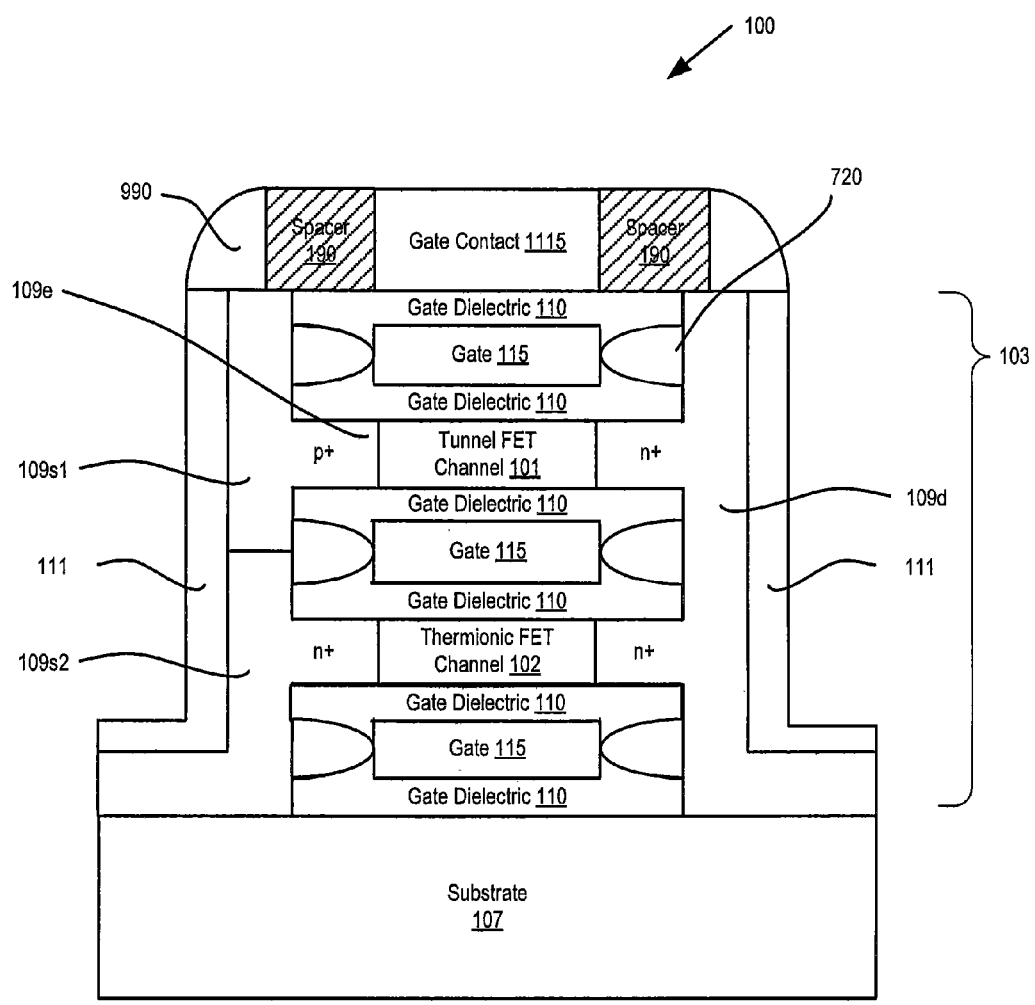
FIG. 1 is a cross sectional view illustrating an n-channel hybrid tunnel FET/thermionic FET device in accordance with some embodiments of the present inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions are not shown to scale, and in some instances may be exaggerated for clarity.

The following description is presented to enable one of ordinary skill in the art to make and use the inventive concepts and is provided in the context of a patent application and its requirements. Various modifications to the exemplary embodiments and the generic principles and features described herein will be readily apparent. The exemplary embodiments are mainly described in terms of particular methods and devices provided in particular implementations. However, the methods and devices may operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include fewer or additional components than those shown, and variations in the arrangement and type of the components may be made without departing from the scope of the inventive concepts. The exemplary embodiments will also be described in the context of particular methods having certain steps or operations. However, the methods and devices may operate effectively for other methods having different and/or additional steps/operations and steps/operations in different orders that are not inconsistent with the exemplary embodiments. Thus, the present inventive concepts are not intended to be limited to the embodiments shown, but is to be accorded the widest scope consistent with the principles and features described herein.

Some embodiments of the present inventive concepts may arise from realization that neither thermionic FETs nor tunnel FETs can operate over a wide range of supply voltages $V_{DD}$ with good performance. This may create practical problems for CPU design; for example, while a CPU may typically operate in low-$V_{DD}$/low-power mode, it should be capable of occasional bursts of high-performance, which may be achieved by supply voltage $V_{DD}$ overdrive.

Embodiments of the present inventive concepts introduce a FET device that combines features of thermionically-injected FETs and tunnel FETs (TFETs) in a single device structure, having a same layout area or footprint relative to a single nanosheet-based FET. The device structure includes a stack of several semiconductor nanosheets, associated epitaxially-grown source and drain regions, and a high-k semiconductor or metal gate stack that wraps the entire set/stack of nanosheets. The lower or bottom set of nanosheets can define the thermionically injected FET, while the upper or top set of nanosheets can define the TFET, or vice versa. The TFET may be distinguished by a source region having an opposite doping type than the drain region. For example, for an n-channel device, the source region of the thermionic FET is n+, while the source region of the TFET is p+ (the doping types are reversed for a p-channel device). The p-n junction between the source region and TFET channel creates the band-to-band tunneling (BTBT) region required for TFET operation.

Embodiments of the present inventive concepts further provide multiple operating modes for the combined thermionic FET/tunnel FET device: a first mode in which the device is operated as a TFET using a supply voltage $V_{DD}$ below the thermionic FET threshold voltage Vt(thermionic), and a second mode in which the device is operated as a thermionic FET by increasing the supply voltage $V_{DD}$ beyond the thermionic FET threshold voltage Vt(thermionic). The TFET mode can be used for low-power, non-performance-critical operations, while the thermionic mode can be used during high-power or peak performance times. In addition, in the TFET mode, there may be very little additional capacitive loading due to the presence of the thermionic FET, as the thermionic FET is deep in the sub-threshold regime and has low gate capacitance (e.g., only parasitic capacitance may contribute to capacitive loading). Thus, by combining two types of transistors into a single device structure, low-frequency, low-$V_{DD}$ operation can be enabled in a TFET operating mode, while high-frequency, high-power operation can be enabled in a thermionic operating mode, without increasing the device layout area beyond that required for a single TFET or thermionic FET.

Figure 2:
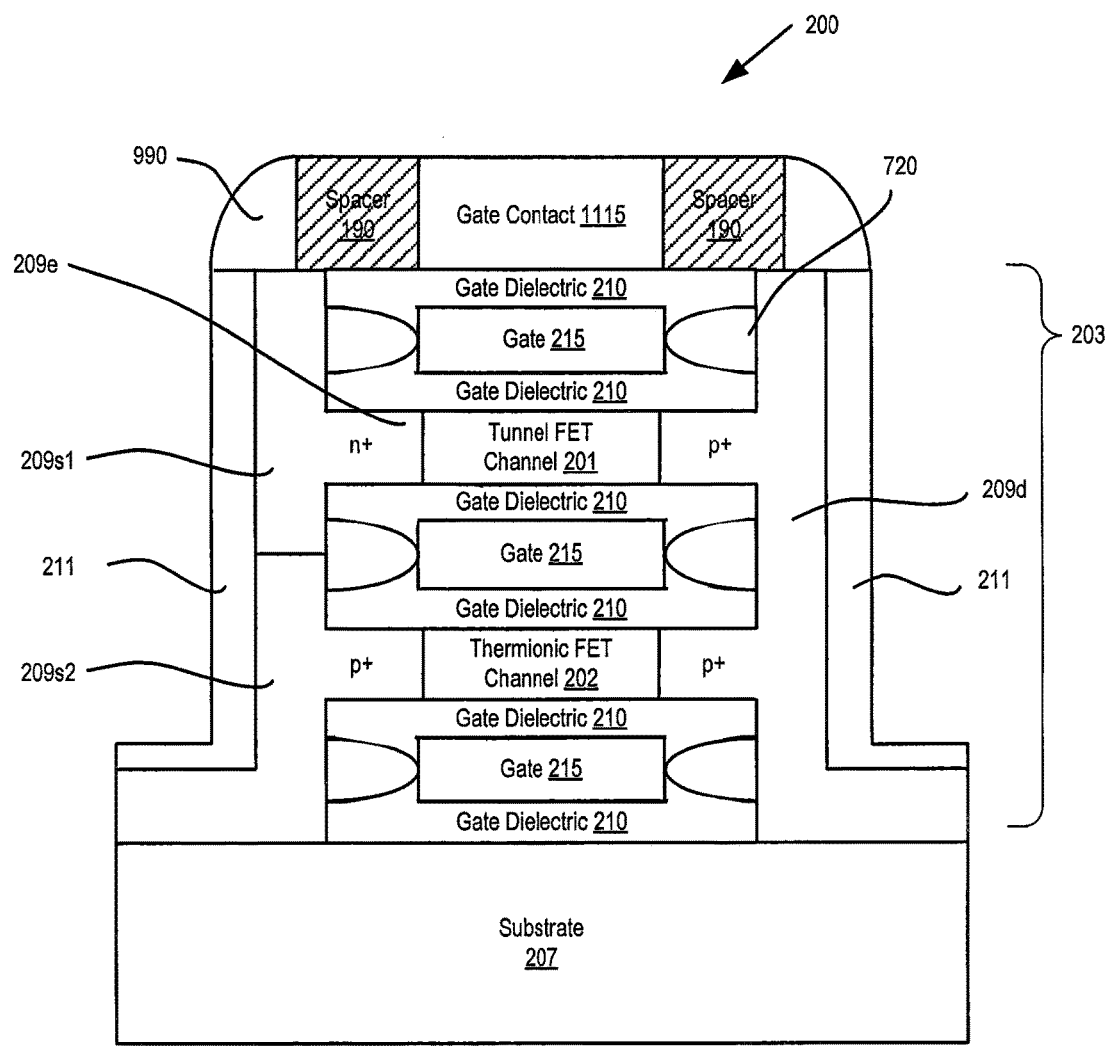
FIG. 2 is a cross sectional view illustrating a p-channel hybrid tunnel FET/thermionic FET device in accordance with some embodiments of the present inventive concepts.

Heterogeneous nanosheet or nanowire-based structures that combine a thermionic FET and a tunnel FET according to embodiments of the inventive concepts are illustrated by way of example in FIGS. 1 and 2. In particular, FIGS. 1 and 2 are cross sectional views illustrating heterogeneous nanosheet stack structures 103, 203 for n-channel and p-channel devices 100 and 200, respectively. Referring now to FIGS. 1 and 2, the devices 100, 200 include nanosheet semiconductor active or body layers defining first channel layers or regions 101, 201 for TFETs, and second channel layers or regions 102, 202 for thermionic FETs. In FIGS. 1 and 2, the lower nanosheets in the stack 103, 203 define one or more thermionic FET channels, while the upper nanosheets in the stack 103, 203 define one or more TFET channels by way of example; however, the order of the TFETs and thermionic FETs in the stack 103, 203 may be reversed in some embodiments.

The first and second channel layers 101, 201 and 102, 202 may include the same or common semiconductor materials in different concentrations, or different semiconductor materials. For example, in some embodiments, the TFET channel layers 101, 201 and thermionic FET channel layers 102, 202 may include Group III-V semiconductor materials (such as indium gallium arsenide (InGaAs), indium arsenide (InAs), indium antimonide (InSb), and/or indium gallium antimonide (InGaSb)), and/or may include Group IV semiconductor materials (such as silicon (Si), germanium (Ge), and/or silicon germanium (SiGe)). In particular embodiments, InGaSb-based channels may be used to provide good pFET thermionic performance if Group III-V channel materials are specified. The stoichiometry of the channel layers 201, 202 of the pFET 200 is not necessarily identical to that of the channel layers 101, 102 of the nFET 100, but similar stoichiometries may be used for the channel layers of both the nFET 100 and the pFET 200 for ease of integration.

Source regions 109s1/s2, 209s1/s2 and drain regions 109d, 209d are provided at opposite sides of the first and second channel layers 101, 201 and 102, 202, and contact the first and second channel layers 101/201 and 102/202 via source/drain extension regions 109e, 209e. The source regions 109s1/s2, 209s1/s2 and drain regions 109d, 209d may be highly doped to provide low contact resistance, and may be formed of the same material as the channel layers 101, 201 and 102, 202 in some embodiments. For example, the source regions 109s1/s2, 209s1/s2 and drain regions 109d, 209d may be epitaxially grown from the channel layer material. The extension regions 109e, 209e may be doped portions of the channel layers 101, 201 and 102, 202 extending from ends thereof to contact the source and drain regions 109s1/s2, 209s1/s2 and 109d, 209d in some embodiments.

As shown in FIGS. 1 and 2, the TFET source regions 109s1, 209s1 have an opposite conductivity type to the thermionic FET source region 109s2, 209s2. In particular, the source region 109s1 of the n-channel device 100 has a p-type doping, while the source region 209s1 of the p-channel device 200 has an n-type doping. The source regions 109s1/s2, 209s1/s2 thus respectively include a p-n junction between the TFET source region 109s1, 209s1 and the thermionic FET source region 109s2, 209s2. Contacts 111, 211 are provided on the source regions 109s1/s2, 209s1/s2 and drain regions 109d, 209d, and provide an electrical short between the TFET source region 109s1, 209s1 and the thermionic FET source region 109s2, 209s2. The contacts 111, 211 may be metal layers, or may otherwise have a composition selected to provide good electrical contact to the thermionic FET, particularly as low parasitic resistance (Rpara) may be of greater importance to the functionality of the thermionic FET.

A shared or common gate stack including gate dielectric layers 110, 210 and gate layers 115, 215 (also referred to herein as a primary gate electrodes) is provided on and between the first and second semiconductor channel layers 101, 201 and 102, 202. The gate dielectric layers 110, 210 may include high-k, wide bandgap semiconductor or insulator layers, while the gate layers 115, 215 may include metal layers or moderate bandgap semiconductor layers with high dopant activation. Low-k insulating regions 720 (such as oxide regions) may extend at opposite sides of the gate layers 115, 215 to provide electrical isolation from the source regions 109s1/s2, 209s1/s2 and drain regions 109d, 209d. Doped extension regions 109e, 209e may laterally extend from the source regions 109s1/s2, 209s1/s2 and drain regions 109d, 209d beyond the low-k insulating regions 720 to contact adjacent ends of the channel layers 101, 201 and 102, 202. The relatively small separation between the source regions 109s1/s2, 209s1/s2 and the gate layers 115, 215 may reduce parasitic resistance, particularly in comparison to some planar devices. A gate contact structure 1115 (also referred to herein as a secondary gate electrode) may extend on upper surfaces and sidewalls of the nanosheet stack 103, 203 between the spacers 190 to contact the gate layers 115, 215. The gate contact structure 1115 may be integrally formed with the gate layers 115, 215 in some embodiments.

The first and second channel layers 101, 201 and 102, 202 define different threshold voltages Vt for the TFETs and thermionic FETs, respectively. The different threshold voltages Vt for the channel layers may be achieved by including additional doped regions or layers in the channel layers of either the TFET 101, 201 or the thermionic FET 102, 202. For example, the different doping concentrations may be implemented by forming an extended, moderately doped layer, or a high-concentration, thin layer ("delta-doping") in either the TFET channel layers 101, 201 or the thermionic FET channel layers 102, 202 during epitaxial layer deposition of the stack structure. Additionally or alternatively, the different threshold voltages Vt for the channel layers may be achieved by forming the first and second channel layers 101, 201 and 102, 202 to different thicknesses. For example, the nanosheet channel layers 101, 201 for the TFET may be deposited to a lesser thickness than the nanosheet channel layers 102, 202 for the thermionic FET. The thickness of the TFET channel layers 101, 201 may still be sufficient to reduce or prevent band-to-band tunneling on the drain side of the devices 100, 200 at gate voltages greater than the threshold voltage of the thermionic FET. Also, different vertical spacings may be provided between the thermionic FET channel layers 102, 202 as compared to vertical spacings between the TFET channel layers 101, 201, resulting in different gate fill thicknesses therebetween; in combination with changes in material properties of the gate layer, the different vertical spacings could also be used to achieve the different threshold voltages Vt for the channel layers.

A structure including a channel layer 101, 201 or 102, 202, a gate dielectric layer 110, 210, and a gate layer 115, 215 defines an individually gated channel region, and is repeated to define a plurality of stacked, individually gated channel regions, also referred to herein as a nanosheet stack 103, 203. The nanosheet stack 103, 203 is thus a three-dimensional structure that may be formed on (e.g., as a protruding fin on a surface of) or within (e.g., in a trench defined in) a substrate 107, 207. Although illustrated with reference to a single channel layer for each of the TFET and the thermionic FET for ease of explanation, it will be understood that any number/amount of individually-gated channel layers may be present, for example, based on a desired application. For example, the number or quantity of nanosheet channel layers in the device 100, 200 may be determined by a targeted current carrying capacity for the TFET and/or the thermionic FET. One or more of the channel layers 101, 201 and 102, 202 may be relatively thin (for instance, less than about 10 nanometers in thickness in some embodiments). The substrate 107, 207 may, for example, be a stress-relaxed buffer (SRB) substrate, a silicon-on-insulator (SOI) substrate, or other substrate.

By stacking the sheets in vertical or non-planar configuration, the devices 100, 200 can combine both thermionic and tunnel FET operation with the same area footprint as a single nanosheet FET. Providing the combined thermionic FET/tunnel FET in a stacked device structure having a common layout area or footprint may offer greater gate length (Lg) scalability. Devices in accordance with embodiments of the present inventive concepts may offer an order of magnitude improvement (or more) over thermionic FETs for low-$V_{DD}$ operation, while maintaining the capability of high-performance through $V_{DD}$ overdrive. In contrast, a single device type may offer either a low-$V_{DD}$ mode (in which a thermionic FET may under-perform), or a high-$V_{DD}$ mode (in which a TFET may not deliver the performance worthy of the increased power). By combining TFETs and thermionic FETs in a single device, however, embodiments of the present inventive concepts allow for switching between both operating modes.

Figure 3A:
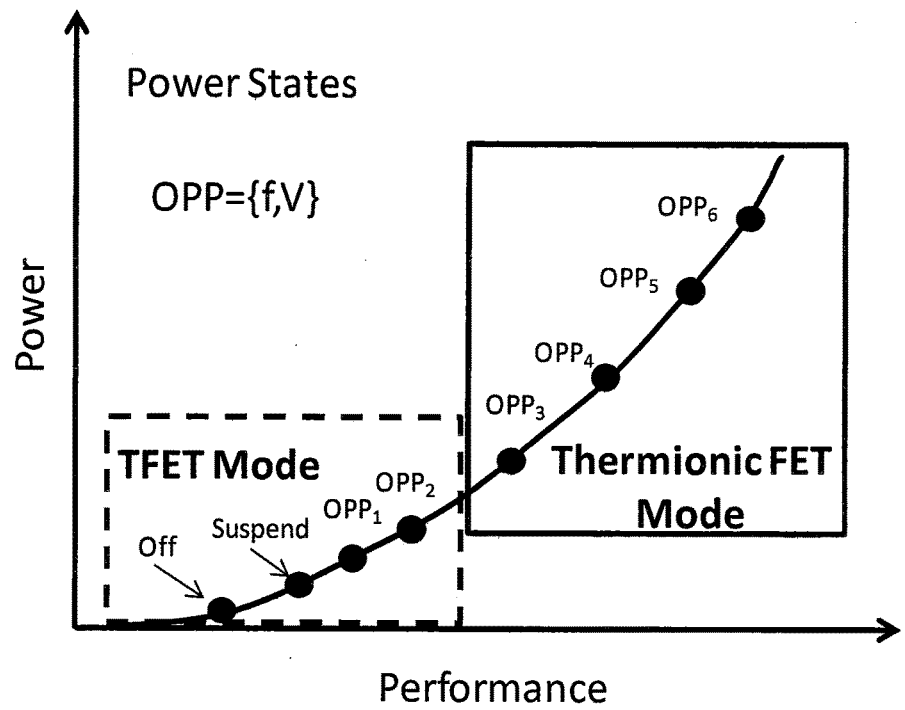
FIGS. 3A-3B are graphs illustrating operating modes of hybrid tunnel FET/thermionic FET devices in accordance with some embodiments of the present inventive concepts.
Figure 3B:
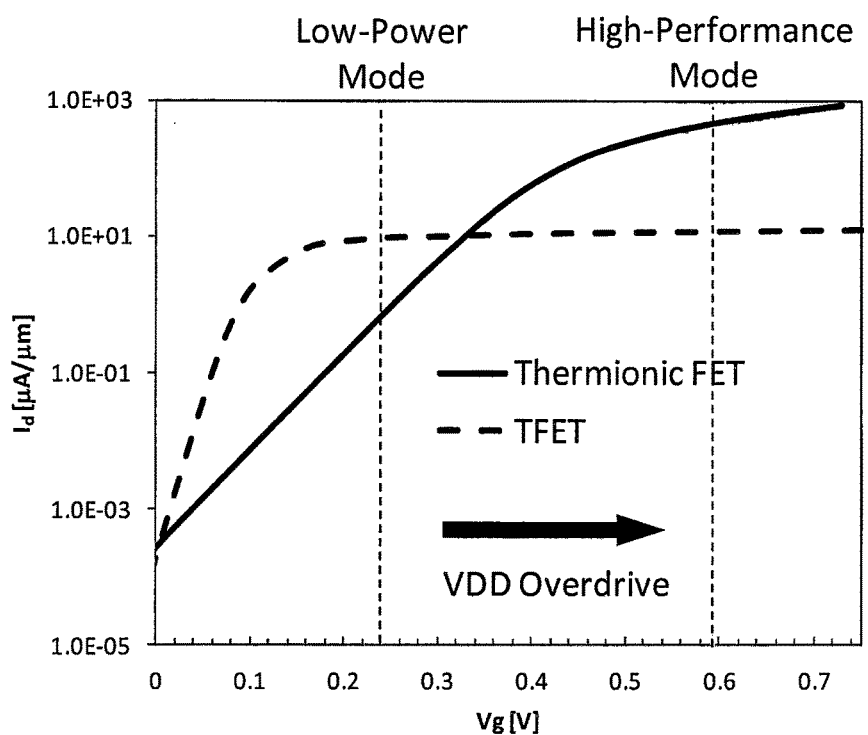

FIGS. 3A-3B are graphs illustrating operating modes of combined tunnel FET/thermionic FET devices in accordance with some embodiments of the present inventive concepts. As shown in FIG. 3A, the supply voltage $V_{DD}$ applied to the gate electrode is partitioned into two device operating modes: TFET mode for lower power, lower frequency operation, and thermionic FET mode for higher power, higher frequency operation. FIG. 3A further illustrates example multiple frequency-VDD operation points OPP1-OPP6 for combined tunnel FET/thermionic FET devices, where two operating points OPP1 and OPP2 are assigned to the TFET operating mode, and four operating points OPP3-OPP6 are assigned to the thermionic operating mode.

More particularly, as shown in FIG. 3B, a relatively low supply voltage $V_{DD}$ (e.g., about 0.2 V to about 0.3 V), which is lower than the threshold voltage of the thermionic FET Vt(thermionic), can be used for the low-power modes. At these lower supply voltages, the thermionic FET is nearly off (that is, without significant conduction), with low total gate capacitance Cgg in subthreshold (FD electrostatics). In contrast, the TFET is operating near peak tunnel current (e.g., about 2 orders of magnitude higher than thermionic FET) in the low-power mode.

Still referring to FIG. 3B, a "standard" supply voltage $V_{DD}$ (e.g., about 0.5 V to about 0.7 V), which is greater than the threshold voltage of the thermionic FET Vt(thermionic), can be used for the high-power modes. The operation of combined tunnel FET/thermionic FET devices according to embodiments of the inventive concepts is thus divided into two regimes: TFET operation for gate voltages Vg<Vt (thermionic), and thermionic FET operation for Vg>Vt (thermionic). As such, an on-current of about 1-2 orders of magnitude higher (i.e., substantially greater) than achievable with the TFET can be used in the high-power mode. Also, the off-current Ioff of the thermionic FET can be targeted based on and/or to match the TFET. As a result, embodiments of the present inventive concepts can provide a low-power device with greatly enhanced overdrive capability.

Although illustrated in FIG. 3A with reference to only two operating points OPP1 and OPP2 in the TFET mode, it will be understood that multiple $V_{DD}$/frequency operating points may be selected and assigned to TFET operation. For example, in some embodiments a greater number of $V_{DD}$/frequency points may be assigned to TFET operation than to thermionic FET operation.

FIGS. 4-11 are cross sectional views illustrating methods of fabricating an n-channel hybrid tunnel FET/thermionic FET device, such as the device 100 of FIG. 1, in accordance with some embodiments of the present inventive concepts. The example embodiments of FIGS. 4-11 are shown with reference to indium gallium antimonide (InGaSb)-based channel layers, as InGaSb can be used for both n- and p-type devices; however, it will be understood that embodiments of the present inventive concepts are not limited to such materials, and other materials may also be used.

Figure 4:
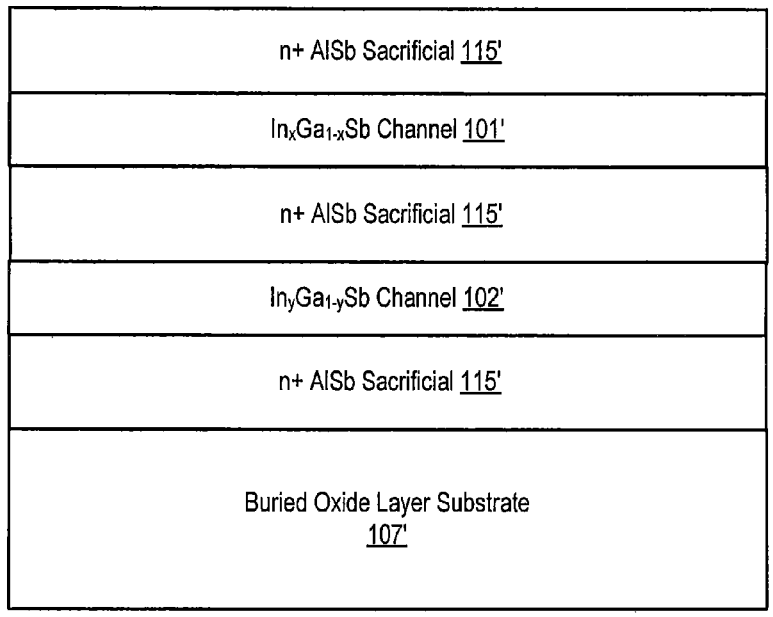
FIGS. 4-11 are cross sectional views illustrating methods of fabricating an n-channel hybrid tunnel FET/thermionic FET device in accordance with some embodiments of the present inventive concepts.

Referring now to FIG. 4, a low-defect or defect-free sacrificial layer (illustrated in FIG. 4 as an aluminum antimonide (AlSb) layer 115') is transferred to a substrate (illustrated as a buried oxide (BOX) substrate 107'). The substrate 107' may be on a silicon-on-insulator (SOI) wafer (or other substrate-on-insulator) from a stress-relaxed buffer (SRB) donor wafer in some embodiments. An initial nanosheet stack including AlSb sacrificial layers 115' alternating with indium gallium antimonide (InGaSb) nanosheet channel layers 101', 102' is formed on the transferred AlSb sacrificial layer 115', for example, by heteroepitaxial growth. The number of nanosheet channel layers 101', 102' in the stack may be formed as desired for circuit operation. That is, the number of nanosheet channel layers 101', 102' can be different for different circuits on chip, as desired for a particular application.

Still referring to FIG. 4, the $In_xGa_{1-x}Sb$ layer 101' and $In_yGa_{1-y}Sb$ layer 102' define channel regions of a tunnel FET and thermionic FET, respectively, and may have different concentrations (e.g., x≠y) in some embodiments. While illustrated as single layers, it will be understood that multiple $In_xGa_{1-x}Sb$ tunnel FET channel layers 101' and/or multiple $In_yGa_{1-y}Sb$ thermionic FET channel layers 102' may be formed. The respective compositions of the $In_xGa_{1-x}Sb$ layer 101' and $In_yGa_{1-y}Sb$ layer 102' may differ, and may be individually selected to increase or optimize characteristics of the tunnel FET and/or the thermionic FET, respectively. The AlSb layers 115' are sacrificial layers, where AlSb was selected as a material for the sacrificial layers based on its etching selectivity relative to InGaSb. As such, it will be understood that embodiments of the inventive concepts are not limited to the particular materials shown in FIGS. 4-11, and, in embodiments where other semiconductor materials are selected for the channel layers 101', 102' of tunnel FETs and thermionic FETs, a different material may be selected for the sacrificial layers 115' to allow for selective etching relative to the channel layers 101', 102'.

Figure 5:
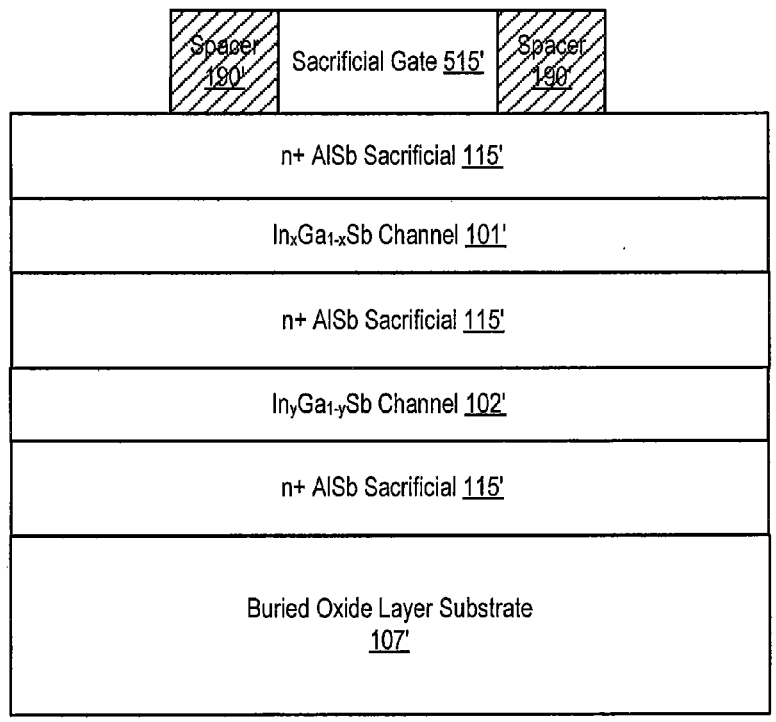
Figure 6:
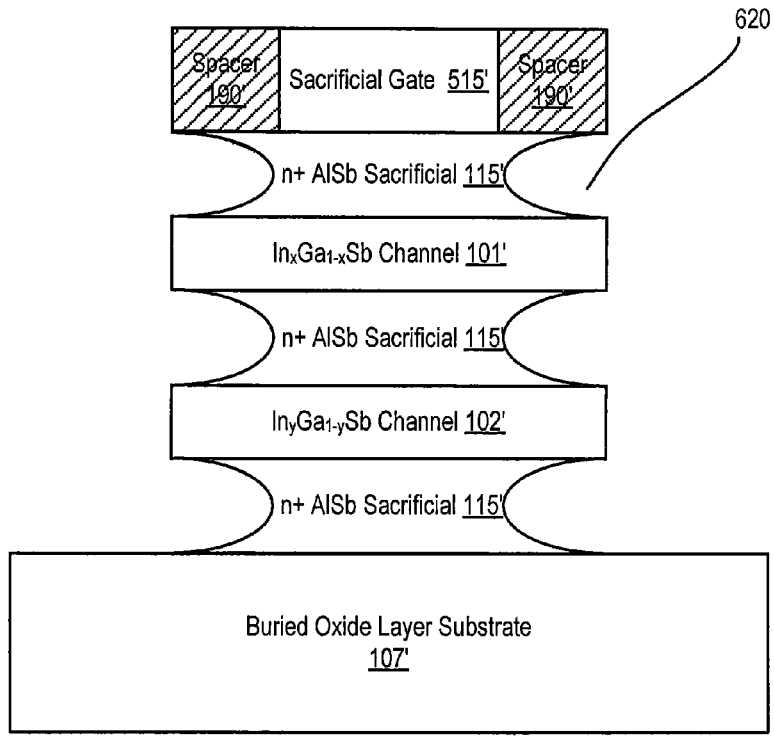

Referring to FIG. 5, a sacrificial gate layer 515' and spacers 190' are deposited and patterned on an uppermost sacrificial layer 115' of the nanosheet stack. The sacrificial gate layer 515' and spacers 190' may extend on sidewalls of the stack and on an upper surface therebetween. As shown in FIG. 6, areas of the stack exposed by the spacers 190' are etched, to provide areas for the source and drain regions to be formed in subsequent operations. As further illustrated in FIG. 6, edges of the AlSb sacrificial layers 115' exposed by the initial etch are laterally etched (for example, using a timed, isotropic selective etch), thereby defining voids 620 (for example, having a "half-moon" shape) at the edges of the AlSb sacrificial layers 115'. For instance, a selective etch of AlSb (with etch selectivity of up to about 1000:1 relative to InGaSb) may be performed. As such, edges of the sacrificial layers 115' include regions 620 that are laterally recessed relative to the channel layers 101', 102', where the recessed regions 620 are bounded by the channel layers 101', 102' and the spacers 190'.

Figure 7:
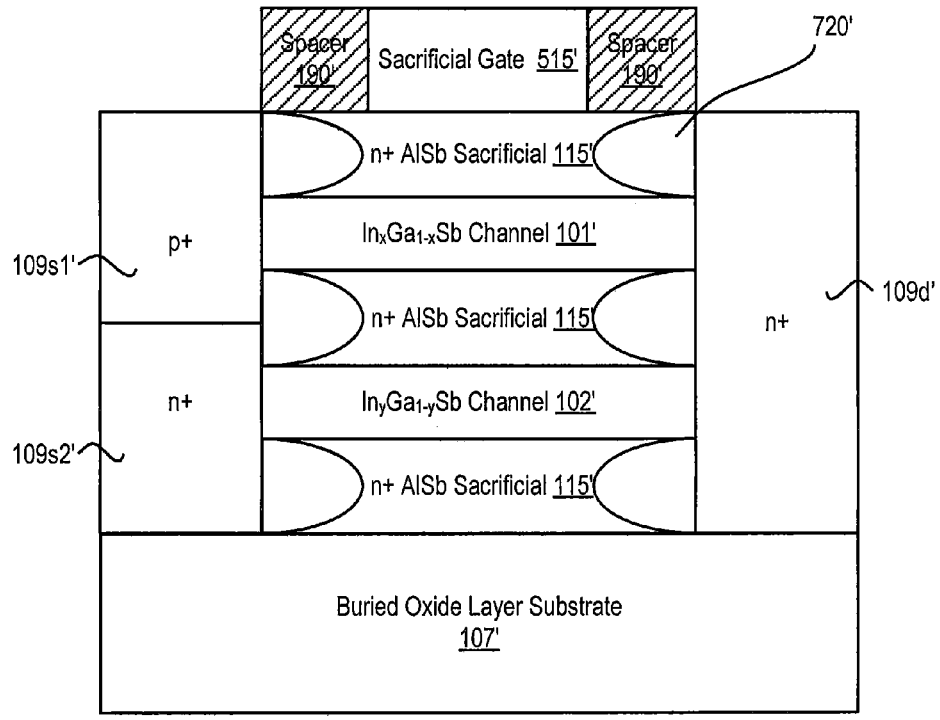

Referring now to FIG. 7, a low-k material is deposited over the stack, filling the voids 620. In some embodiments, the spacers 190' can be removed before the low-k material deposition. An anisotropic vertical etch (for example, a plasma or similar etch) is performed, removing the low-k material from regions other than the filled-in voids 620, thereby defining dielectric suspension regions 720' at the edges of the sacrificial layers 115'. The dielectric regions 720' insulate the gate layers (to be formed in subsequent operations) from source and drain regions 109s1'/109s2' and 109d', which are epitaxially grown on opposite sides of the channel layers 101', 102'. For example, remaining portions of channel material (i.e., portions of $In_xGa_{1-x}Sb$ 101' and $In_yGa_{1-y}Sb$ 102' at sidewalls of the stack) may be used as seed layers for epitaxial growth of the source and drain regions 109s1'/109s2' and 109d' on the BOX substrate 107'. Other processes can also be used (additionally or alternatively) to form the source and drain regions 109s1'/109s2' and 109d', depending on underlying the substrate material (e.g., if the substrate 107' is not BOX). The source and drain regions 109s1'/109s2' and 109d' may be formed to have an indium (In) composition matching that of the thermionic FET channel layer 102' (that is, with a lower In content than the TFET channel layer 101'). While stress-relaxation may be possible due to height and/or mismatch, such stress relaxation may not be problematic in the source and drain regions 109s1'/109s2' and 109d'.

As discussed above, for combined tunnel/thermionic n-FET device 100', the drain 109d' is fully n-type, while the source includes a p-type portion 109s1' defining the source of the n-type tunnel FET, and also an n-type portion 109s2' defining the source of the n-type thermionic FET. In some embodiments, to fabricate the source regions to include portions 109s1' and 109s2' having different semiconductor conductivity types, the n+ source region 109s2' may be grown at the same time as the n+ drain region 109d', the n+ source region 109s2' may be partially recessed, and the p+ source region 109s1' may be grown on the recessed n+ source region 109s2'. In particular: n+ epitaxy may be performed on both the source and drain side to grow regions 109s2' and 109d', respectively; the source region 109s2' may be partially recessed, with the drain region 109d' masked, such that the recession exposes a sidewall of the TFET channel layer 101'; and p+ epitaxy may be performed with the drain region 109d' masked to form the p+ TFET source region 109s1' directly on the n+ thermionic FET source region 109s2', defining a p-n junction therebetween.

Alternatively, to fabricate the source regions to include portions 109s1' and 109s2' having different conductivity types, the drain region 109d' may be selectively formed while the source side of the stack is masked, and then the source region 109s1'/109s2' may be selectively formed while the drain region 109d' is masked. For example, after growth of the drain region 109d', a long-throw PVD process may be used to deposit a polycrystalline source region 109s1'/109s2' while the drain region 109d' is masked, where the first portion of PVD process uses n+ doping, and the second portion of the PVD process uses p+ doping. In particular: n+ epitaxy may be selectively performed on the drain side (with the source side masked) to form the drain region 109d'; long-throw PVD may be performed to deposit polycrystalline InGaSb on the source side (with the drain region 109d' masked), with a first phase of deposition using n+ doping and a second phase of the deposition using p+ doping to define regions 109s1' and 109s2', respectively; and a chemical-mechanical polishing (CMP) process may be used to remove excess deposited InGaSb. Such a polycrystalline source region may not be problematic for device operation, as the source extension regions 109e' (discussed below) may be mono-crystalline. It will be understood that, while described above with reference to source/drain fabrication for n-FET devices, the respective doping types may be switched for p-FET devices.

Figure 8:
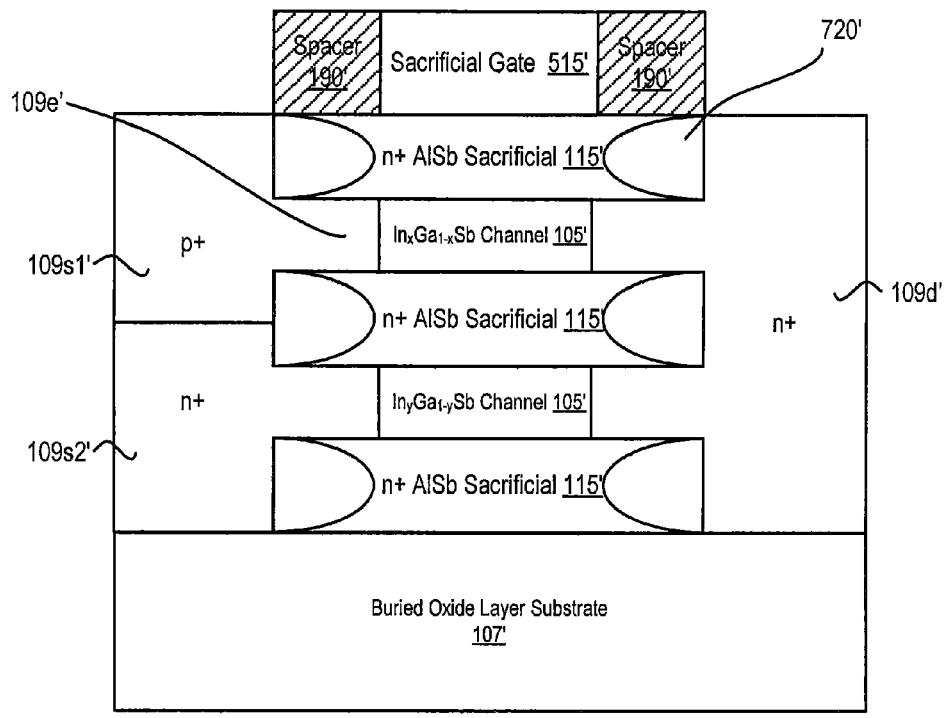

FIG. 8 illustrates formation of doped source/drain extension regions 109e' in portions of the channel layers 101', 102' adjacent the low-k dielectric regions 720'. In particular, an anneal (and/or other appropriate steps) may be performed to define doped extension regions 109e' at ends or edges of the channel layers 101' and 102' adjacent the previously formed dielectric regions 720', contacting the source and drain regions 109s1'/109s2' and 109d'. The extension regions 109e' may reduce parasitic resistance (Rpara) by reducing separation between the source region 109s1'/109s2' and the subsequently formed gate layers 115". Other techniques may also be used to form the doped extension regions 109e', such as implant or plasma doping prior to the source and drain regrowth in FIG. 7. As such, the operations of FIG. 8 may be performed prior to or concurrently with the operations of FIG. 7 in some embodiments.

Figure 9:
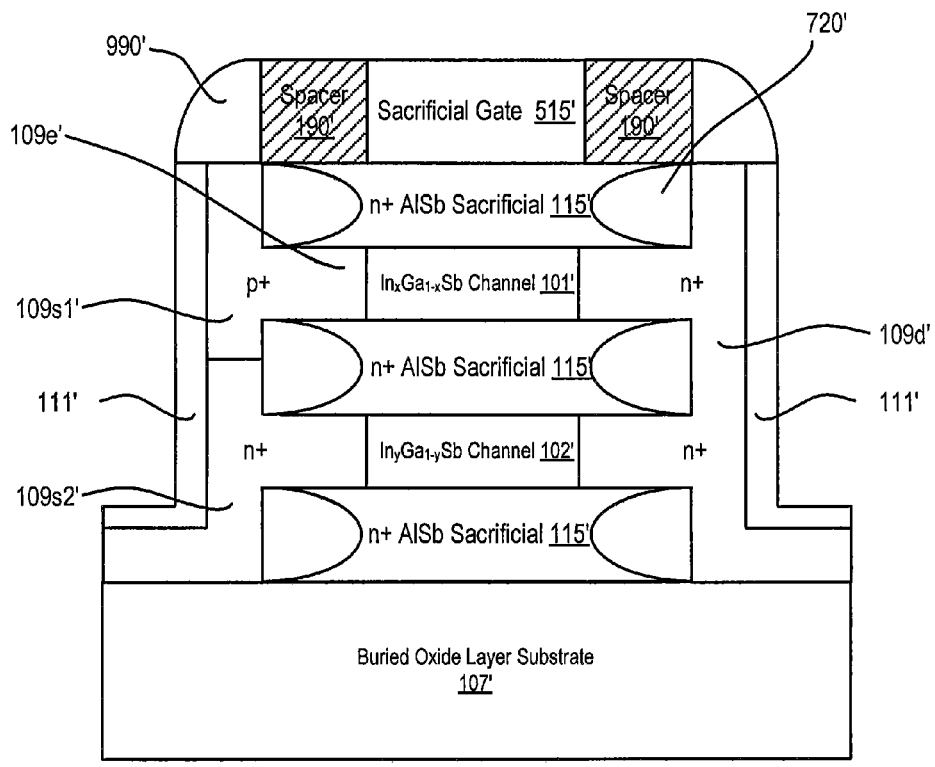

Referring now to FIG. 9, spacers 990' are formed on the source and drain regions 109s1'/109s2' and 109d' at opposite sides of the spacers 190', and the source and drain regions 109s1'/109s2' and 109d' are at least partially recessed towards the substrate 107' such that sidewalls thereof are aligned with the spacers 990'. Also, a silicide layer 111' or other conductive contact region material (such as a metal layer having low interfacial resistivity to the n+ and p+ regions) is formed on the recessed source and drain regions 109s1'/109s2' and 109d'. The low interfacial resistivity may be of greater importance in the n+ regions and/or to the functionality of the thermionic FET. The silicide layer 111' provides an electrical short across the p-n junction defined in the source region 109s1'/109s2'.

Figure 10:
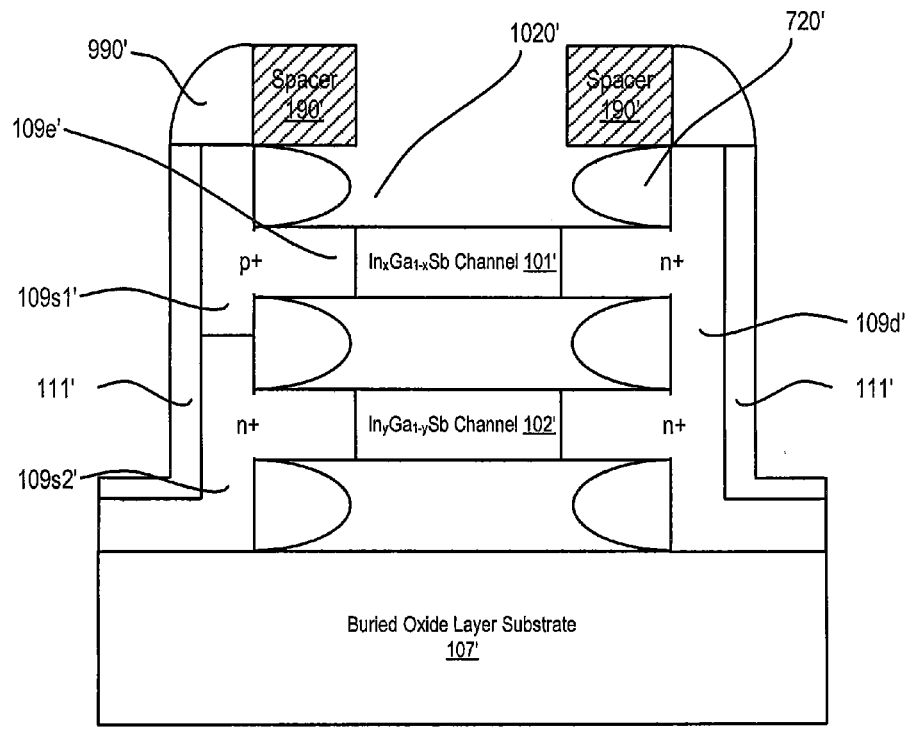

As shown in FIG. 10, the sacrificial gate layer 515' and the sacrificial AlSb layers 115' are selectively removed, defining voids 1020' around the remaining InGaSb channel layers 101' and 102'. For instance, a selective etch of AlSb (with etch selectivity of up to about 1000:1 relative to InGaSb) may be performed, such that the InGaSb channel layers 101' and 102' are largely undisturbed by the etching process.

Figure 11:
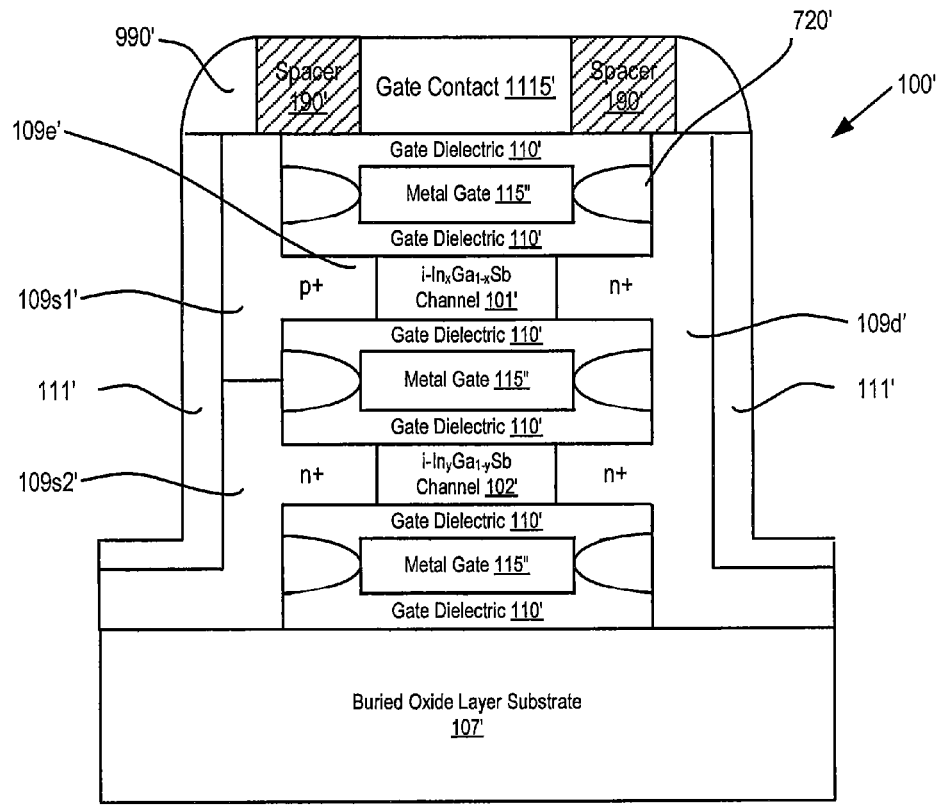

In FIG. 11, the voids 1020' surrounding the channel layers 101' and 102' are filled with a dielectric layer 110' and a metal layer 115" to define a wraparound metal gate structure that is common to both the TFET and the thermionic FET. In particular, a high-k dielectric material is deposited on to the InGaSb channel layers 101' and 102' to define respective gate dielectric layers 110' thereon, and a metal layer is deposited on the gate dielectric layers 110' to define the metal gate layers 115" between the channel layers 101' and 102'. A gate contact structure 1115' may extend on upper surfaces and sidewalls of the nanosheet stack between the spacers 190' to contact the metal gate layers 115", where the gate contact structure 1115' may be integrally formed in deposition of the metal layers 115" in some embodiments. As such, a stacked structure including channel layers 101', 102' with gate layers 115" therebetween and a wraparound gate structure 110', 115", 1115' defines a completed nFET device 100'. The InGaSb channels 101' and 102' may be intrinsic or undoped n-type in the nFET device 100' of FIG. 11, and are stacked to define a fin-shaped device structure (or finFET).

As noted above, the threshold voltages Vt of the thermionic and TFET channel layers 102' and 101' may differ, and can be adjusted so that the off-state leakage is approximately the same for both sets of channel layers 102' and 101' (particularly for higher supply voltages; the thermionic device may have reduced leakage at lower supply voltages). Since both sets of channel layers 102' and 101' share the same gate stack (unless additional processing is done to provide distinct gate stacks), one way to introduce a relative, intra-device Vt-shift is to provide a doped layer or region in either the thermionic channel layer(s) 102' or in the TFET channel layer(s) 101', to achieve the higher threshold voltage Vt. The doping level may be sufficiently high to delay the onset of full depletion (FD), thereby raising the threshold voltage Vt, but not so high as to render the layer "undepletable", i.e., by inducing surface inversion prior to full depletion (FD). The doping level is thus engineered suitably for the nanosheet channel layer thickness used. This doping level can be implemented by including an extended, moderately doped layer, or a high-concentration, thin layer ("delta-doping") in the channel layer 101' or 102'. The epitaxial nature of the channel layer growth in accordance with embodiments of the present inventive concepts may allow for straightforward formation of such an additional doped layer to provide the desired threshold voltages for the channel layers 101' and 102'.

In addition, the channel layer thickness and composition of the TFET and thermionic channel layers 101' and 102' are selected such that band-to-band tunneling (BTBT) does not occur on the drain side during high-$V_{DD}$ operation. While BTBT is required for normal operation of the TFET on the source side, it may contribute to parasitic leakage on the drain side; the same may be true for the drain side of the thermionic FET. This problem can be particularly acute for the TFET, since the composition of the TFET channel layer 101' is selected to promote BTBT (e.g., using a low-bandgap material). In some embodiments, however, this problem can be solved by reducing the thickness of the channel layers 101' and/or 102' to increase the effective bandgap to the point of acceptable BTBT, and engineering the source-side of the TFET junction to increase the tunneling current (if needed). However, even in the absence of additional source-side engineering, the TFET source-channel junction may inherently provide significantly more tunneling current than the drain side due to the gate bias (which increases the tunneling window). Additional increases can be engineered by allowing deeper p+ in-diffusion into the TFET channel layer 101' (for example, by increasing the p+ doping); the more heavily doped source extension 109e' that results has a narrower bandgap due to doping-induced bandgap-narrowing.

FIGS. 12-19 are cross sectional views illustrating methods of fabricating an n-channel hybrid or combined tunnel FET/thermionic FET device 1200 in accordance with further embodiments of the present inventive concepts. While the embodiments of FIGS. 12-19 are shown with reference to indium gallium arsenide (InGaAs)-based channel layers by way of example, it will be understood that embodiments of the present inventive concepts are not limited to such materials, and other materials may also be used.

Figure 12:
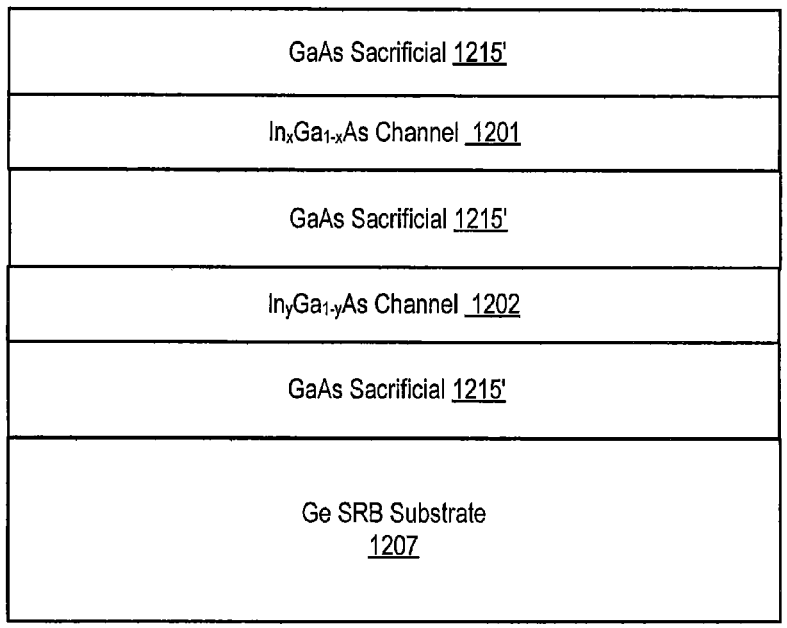
FIGS. 12-19 are cross sectional views illustrating methods of fabricating an re-channel hybrid tunnel FET/thermionic FET device in accordance with further embodiments of the present inventive concepts.

Referring now to FIG. 12, an initial stack including alternating gallium arsenide (GaAs) sacrificial layers 1215' and indium gallium arsenide (InGaAs) channel layers 1201, 1202 is formed on a substrate 1207, for example, by epitaxial growth. In FIGS. 12-19, the substrate is a germanium (Ge) stress-relaxed buffer (SRB) substrate 1207, but other substrates may be used. The number or amount of InGaAs nanosheet channel layers 1201, 1202 in the stack may be formed as desired for circuit operation. That is, the number/amount of InGaAs nanosheet channel layers 1201, 1202 can be different for different circuits on chip, as desired for a particular application.

Still referring to FIG. 12, the $In_xGa_{1-x}As$ channel layer 1201 and $In_yGa_{1-y}As$ channel layer 1202 define channel regions of a tunnel FET and a thermionic FET, respectively. The respective compositions of the $In_xGa_{1-x}As$ layer 1201 and $In_yGa_{1-y}As$ layer 1202 may differ (e.g., x≠y), and may be individually selected to increase or optimize characteristics of the tunnel FET and/or the thermionic FET, respectively. For example, in particular embodiments, x≈0.8 for the $In_xGa_{1-x}As$ channel layer 1201, and y≈0.5 for the $In_yGa_{1-y}As$ channel layer 1202. The InGaAs channel layers 1201, 1202 may be strained, and may not relax due to respective thicknesses of only a few nanometers. It will be noted that strain in the channel layers 1201, 1202 may be of lesser importance to device operation, but that relaxation can be avoided to reduce defectivity. Also, while the lower nanosheet(s) 1202 in the stack define one or more thermionic FET channels and the upper nanosheet(s) 1201 in the stack define one or more TFET channels by way of example, the order of the TFETs and thermionic FETs in the stack may be reversed in some embodiments.

The GaAs layers 1215' are sacrificial layers, and are nearly or substantially lattice-matched to the Ge SRB substrate 1207. GaAs may be selected as a material for the sacrificial layers 1215' based on its etching selectivity relative to InGaAs. As such, it will be understood that embodiments of the inventive concepts are not limited to the particular materials shown in FIGS. 12-19, and when other semiconductor materials are selected for the channel layers 1201, 1202 of tunnel FETs and thermionic FETs, a different material may be selected for the sacrificial layers 1215' to allow for selective etching relative to the channel layers 1201, 1202.

Figure 13:
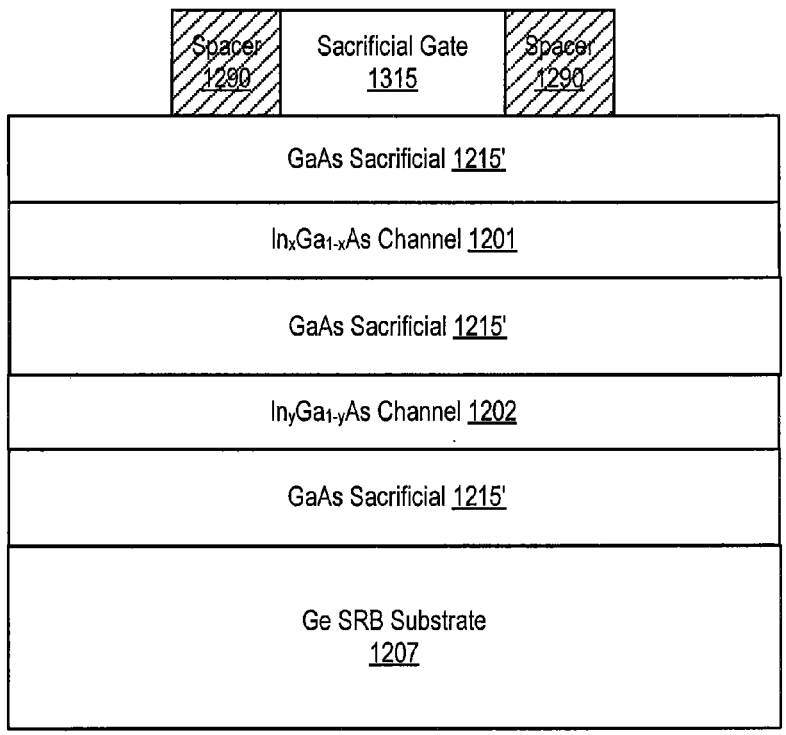
Figure 14:
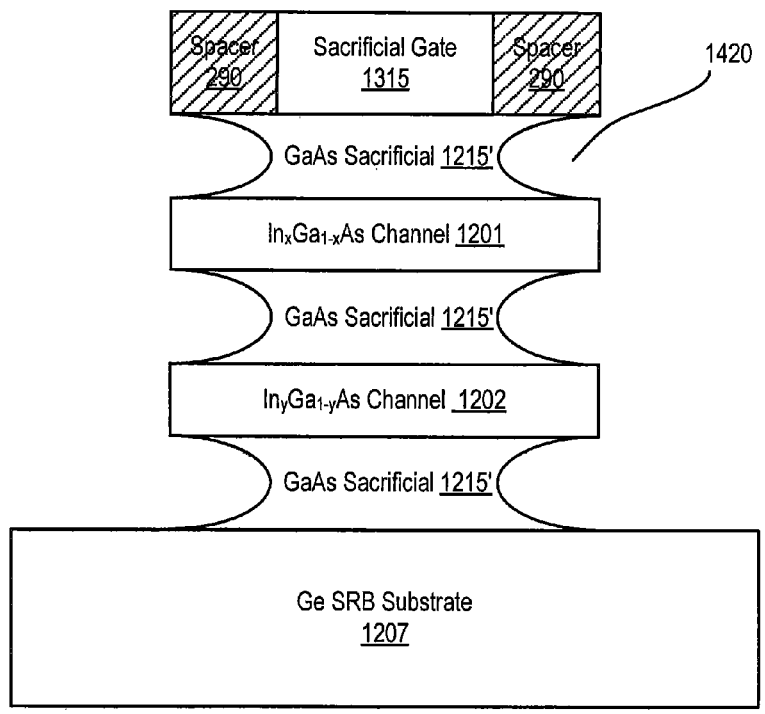

As shown in FIG. 13, a sacrificial gate layer 1315 and spacers 1290 are deposited and patterned on an uppermost sacrificial layer 1215' of the nanosheet stack. The sacrificial gate layer 1315 and spacers 1290 may extend on sidewalls of the stack and on an upper surface therebetween. In FIG. 14, an initial etch is performed to remove areas of the stack exposed by the spacers 1290 to define areas for the source/drain regions to be formed in subsequent operations. As further illustrated in FIG. 14, edges of the GaAs sacrificial layers 1215' exposed by the initial etch are laterally etched (for example, using a timed, isotropic selective etch), thereby defining voids 1420 (for example, having a "half-moon" shape) at the edges of the GaAs sacrificial layers 1215'. For instance, a selective etch of GaAs (with etch selectivity of up to about 1000:1 relative to InGaAs) may be performed. As such, edges of the sacrificial layers 1215' include regions 1420 that are laterally recessed relative to the channel layers 1201, 1202, where the recessed regions 1420 are bounded or surrounded by the channel layers 1201, 1202 and the spacers 1290.

Figure 15:
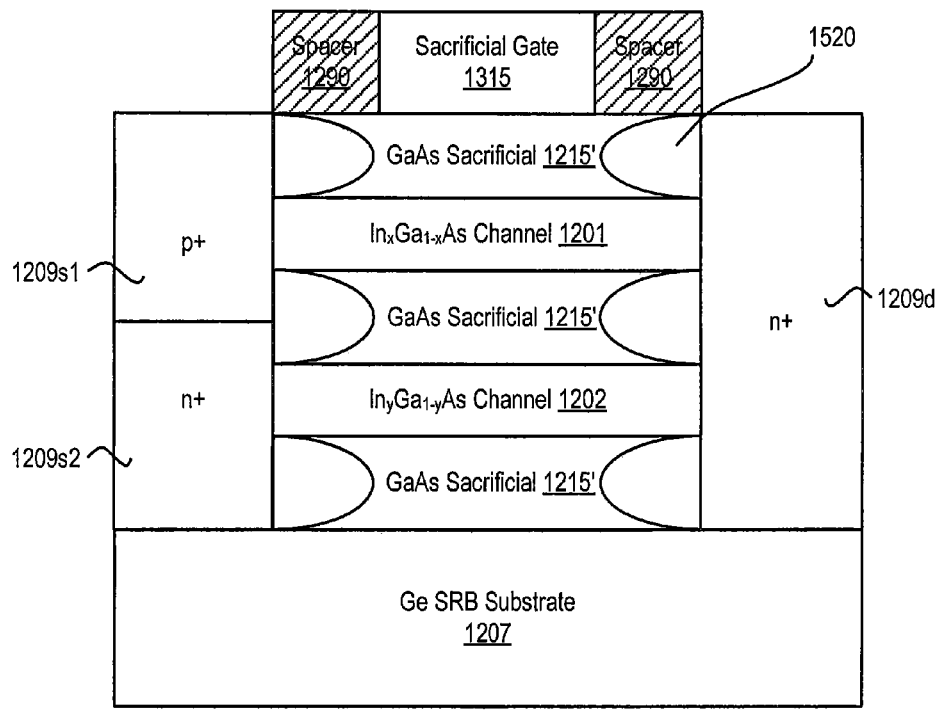

Referring now to FIG. 15, a low-k material is deposited over the stack, filling the voids 1420. In some embodiments, the spacers 1290 can be removed before the low-k material deposition. An anisotropic vertical etch (for example, a plasma or similar etch) is performed, removing the low-k material from regions other than the filled-in voids 1420, thereby defining dielectric suspension regions 1520 at the edges of the sacrificial layers 1215'. The dielectric regions 1520 insulate the gate layers (formed in subsequent operations) from the source and drain regions, 1209s1/1209s2 and 1209d, which are epitaxially grown on opposite sides of the channel layers 1201, 1202. For example, remaining portions of channel layer material (i.e., $In_xGa_{1-x}As$ 1201 and $In_yGa_{1-y}As$ 1202 at sidewalls of the stack) may be used as seed layers for epitaxial growth of the source and drain regions 1209s1/1209s2 and 1209d on the Ge SRB substrate 1207. Other processes can also be used (additionally or alternatively) to form the source and drain regions 1209s1/1209s2 and 1209d, for example, based on the underlying substrate material. The source and drain regions 1209s1/1209s2 and 1209d may be formed to have an indium (In) composition matching that of the thermionic FET channel layer 1202 (that is, with a lower In content than the TFET channel layer 1201). While stress-relaxation may be possible due to height and/or mismatch, such stress relaxation may not be problematic in the source and drain regions 1209s1/1209s2 and 1209d.

As discussed above, for combined tunnel/thermionic n-FET devices as described herein, the drain 1209d is fully n-type, while the source includes a p-type portion 1209s1 defining the source of the tunnel FET, and also an n-type portion 1209s2 defining the source of the thermionic FET. In some embodiments, to fabricate the source regions to include portions 1209s1 and 1209s2 having different conductivity types, the n+ source region 1209s2 may be grown at the same time as the n+ drain region 1209d, the n+ source region 1209s2 may be partially recessed, and the p+ source region 1209s1 may be grown on the recessed n+ source region 1209s2. In particular: n+ epitaxy may be performed on both the source and drain side to grow regions 1209s2 and 1209d, respectively; the source region 1209s2 may be partially recessed with the drain region 1209d masked, such that the recession exposes an end portion or sidewall of the TFET channel layer 1201; and p+ epitaxy may be performed with the drain region 1209d masked to form the p+ TFET source region 1209s1 directly on the n+ thermionic FET source region 1209s2, defining a p-n junction therebetween.

Alternatively, to fabricate the source regions to include portions 1209s1 and 1209s2 having different conductivity types, the drain region 1209d may be selectively formed while the source side of the stack is masked, and then the source region 1209s1/1209s2 may be selectively formed while the drain region 1209d is masked. For example, after growth of the drain region 1209d, a long-throw PVD process may be used to deposit a polycrystalline source region 1209s1/1209s2 while the drain region 1209d is masked, where the first portion of PVD process uses n+ doping, and the second portion of the PVD process uses p+ doping. In particular: n+ epitaxy may be selectively performed on the drain side (with the source side masked) to form the drain region 1209d; long-throw PVD may be performed to deposit poly-crystalline InGaAs on the source side (with the drain region 1209d masked), with a first phase of deposition using n+ doping and a second phase of the deposition using p+ doping to define regions 1209s1 and 1209s2, respectively; and a chemical-mechanical polishing (CMP) process may be used to remove excess deposited InGaAs. Such a polycrystalline source region may not be problematic for device operation, as the source extension regions 1209e (discussed below) may be mono-crystalline. It will be understood that, while described above with reference to source/drain fabrication for n-FET devices, the respective doping types may be switched for p-FET devices.

Figure 16:
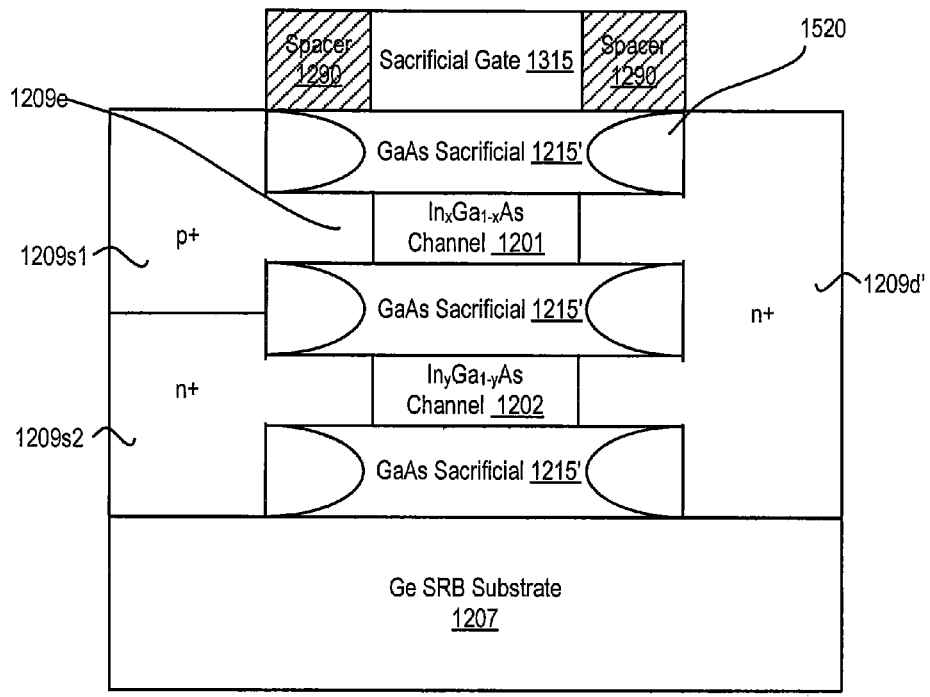

FIG. 16 illustrates formation of doped source/drain extension regions 1209e in portions of the channel layers 1201, 1202 adjacent the low-k dielectric regions 1520. In particular, an anneal (and/or other appropriate operations) may be performed to define doped extension regions 1209e at ends or edges of the channel layers 1201 and 1202 adjacent to the previously formed dielectric regions 1520, contacting the source and drain regions 1209s1/1209s2 and 1209d. The extension regions 1209e may reduce parasitic resistance (Rpara) by reducing separation between the source region 1209s1/1209s2 and the subsequently formed gate layers 1215. Other techniques may also be used to form the doped extension regions 1209e, such as implant or plasma doping prior to the source and drain regrowth in FIG. 15. As such, the operations of FIG. 16 may be performed prior to or concurrently with the operations of FIG. 15 in some embodiments.

Figure 17:
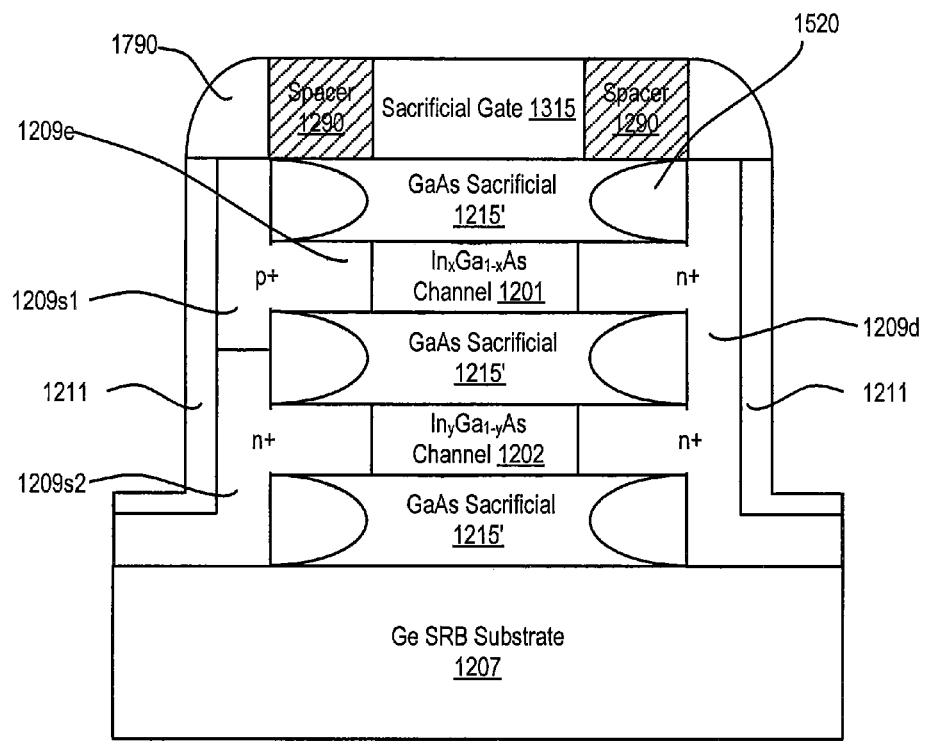

Referring now to FIG. 17, spacers 1790 are formed on the source and drain regions 1209s1/1209s2 and 1209d at opposite sides of the spacers 1290, and the source and drain regions 1209s1/1209s2 and 1209d are at least partially recessed towards the substrate 1207 such that sidewalls thereof are aligned with the spacers 1790. Also, a silicide layer 1211 or other conductive contact region material (such as a metal layer having low interfacial resistivity to the n+ and p+ regions) is formed on the recessed source and drain regions 1209s1/1209s2 and 1209d. The low interfacial resistivity may be of greater importance in the n+ regions and/or to the functionality of the thermionic FET. The silicide layer 1211 provides an electrical short across the p-n junction defined in the source region 1209s1/1209s2. The composition of the silicide or other contact layer 1211 may be selected to provide good contact to the thermionic FET, as low parasitic resistance (Rpara) may be of greater importance to the functionality of the thermionic FET than the tunnel FET. For a Group III-V device, a deposited metal layer may be used for the contacts 1211.

Figure 18:
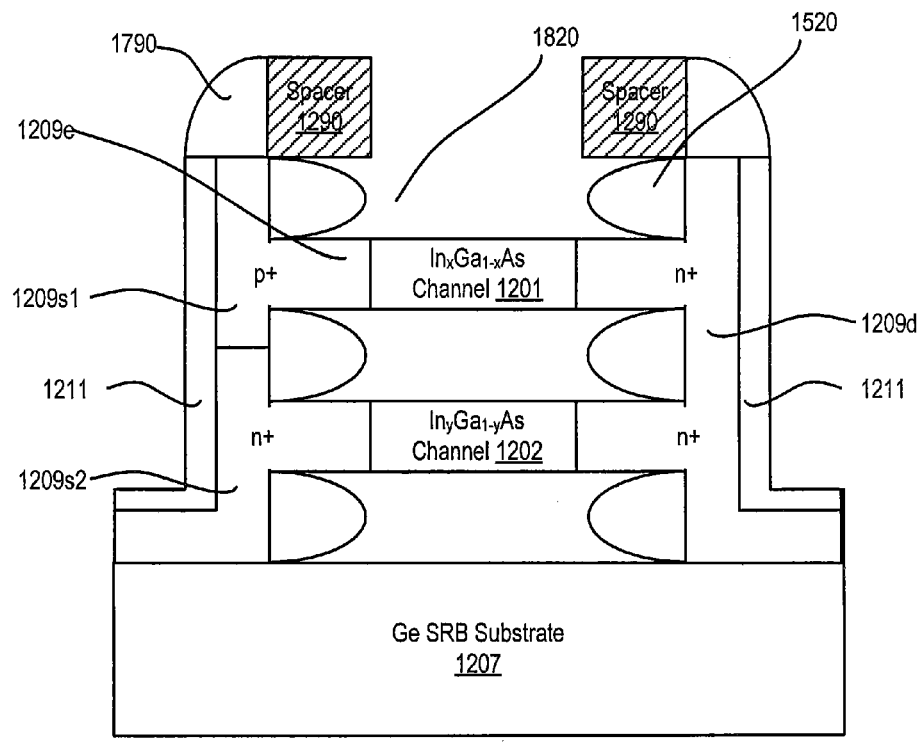

As shown in FIG. 18, the sacrificial gate layer 1315 and the sacrificial GaAs layers 1215' are selectively removed, defining voids 1820 around the remaining InGaAs channel layers 1201 and 1202. For instance, a selective etch of GaAs (with etch selectivity of up to about 1000:1 relative to InGaAs) may be performed, such that the InGaAs channel layers 1201 and 1202 are largely undisturbed by the etching process.

Figure 19:
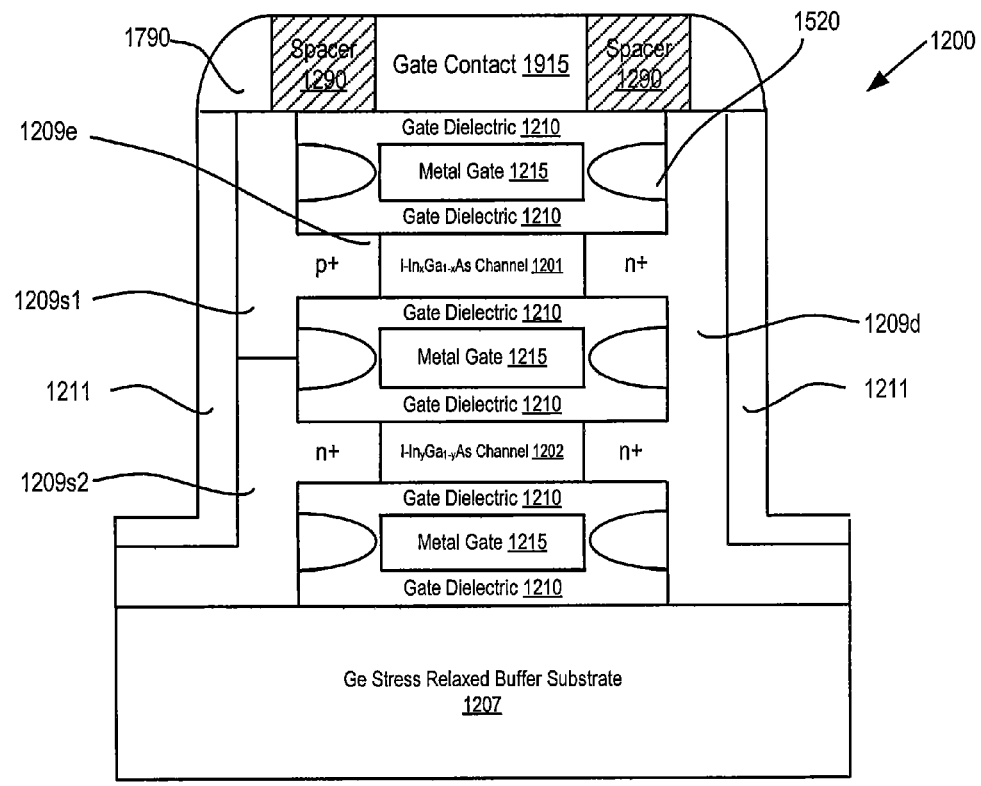

Referring to FIG. 19, the voids 1820 surrounding the channel layers 1201 and 1202 are filled with a dielectric layer 1210 and a metal layer 1215 to define a wraparound metal gate structure that is common to both the TFET and the thermionic FET. In particular, a high-k dielectric material is deposited on to the InGaAs channel layers 1201 and 1202 to define respective gate dielectric layers 1210 thereon, and a metal layer is deposited on the gate dielectric layers 1210 to define the metal gate layers 1215 on and between the channel layers 1201 and 1202. A gate contact structure 1915 may extend on upper surfaces and sidewalls of the nanosheet stack between the spacers 1290 to contact the metal gate layers 1215, where the gate contact structure 1915 may be integrally formed in deposition of the metal layers 1215 in some embodiments. As such, a stacked structure including alternating channel layers 1201, 1202 with gate layers 1215 therebetween and a wraparound gate structure 1210, 1215, 1915 defines a completed nFET device 1200. The InGaAs channels 1201 and 1202 may be intrinsic or undoped n-type in the nFET device 1200 of FIG. 12, and are stacked to define a finFET structure.

Referring again to FIG. 1, still further embodiments of the present inventive concepts can include a fully-crystalline nanosheet stack, including channel layers 101, 102, gate layers 115, and gate dielectric layers 110 formed from monocrystalline semiconductor and/or insulating materials. In particular, rather than forming sacrificial layers between the channel layers and subsequently etching or otherwise removing the sacrificial layers to form the gate layers as described above with reference to FIGS. 4-11 and 12-19, a complete device stack including crystalline gate dielectric layers 110, gate layers 115, and channel layers 101, 102 can be formed, for example, by heteroepitaxial growth. As such, the gate dielectric layers 110 may be a crystalline semiconductor or insulating layer on the substrate 107, and the gate layers 115 and the channel layers 101, 102 may be grown on the crystalline gate dielectric layer 110, such that interfaces with the channel layers 101, 102 are free of amorphous or non-crystalline materials (which may reduce or eliminate surface roughness scattering, improving mobility for at least the thermionic FET), and may be free of low-k crystalline buffer layers (which may reduce the equivalent gate oxide thickness, improving short channel performance for at least the thermionic FET). For the Group IV material system, the gate dielectric layer 110 may be a high-k crystalline insulating layer, such as calcium fluoride ($CaF_2$), zinc sulfide (ZnS), praseodymium oxide ($Pr_2O_3$), and/or gadolinium oxide ($Gd_2O_3$). For the Group III-V material system, the gate dielectric layer 110 may be a high-k crystalline widebandgap Group II-VI semiconductor layer, such as zinc selenide (ZnSe). The gate layer 115 may be a heavily-doped semiconductor. For example, the structure may include a highly-doped aluminum antimonide (AlSb) gate layer 115, and each of the gate 115, channel 101/102, and gate dielectric layers 110 may be monocrystalline in some embodiments. Furthermore, the top gate 1115 surrounding or "wrapping" the stack of nanosheets can be metal or polycrystalline semiconductor.

Embodiments of present inventive concepts may provide several advantages. For example, combined TFET/thermionic FET nanosheet devices as described herein allow for extreme-low-power operation, at very low supply voltages $V_{DD}$, in addition to high-performance operation at moderate supply voltages, combined in a single device. More particularly, embodiments of present inventive concepts may allow an available range of supply voltages $V_{DD}$ of about 0.2 to about 0.3V, which is well below that which is typically achievable with a thermionic FET. In addition, embodiments of present inventive concepts further allow for high-performance operation at moderate supply voltages $V_{DD}$ in a range of about 0.5V to about 0.6V. Furthermore, by stacking the TFET and thermionic FET in a nanosheet stack structure, embodiments of the present inventive concepts incur no layout penalty for such dual-mode use (as both devices are arranged in a common footprint), which may be advantageous over otherwise including thermionic FETs and TFETs in finFET configurations. In addition, nanosheet stack structures in accordance with embodiments of the present inventive concepts can be suitable for aggressive gate length Lg scaling, in contrast with some planar structures.

Features of specific example embodiments of the inventive concepts may include, but are not limited to, the following:

(1) A FET comprised of a stack of nanosheets, a first portion of the stack of nanosheets comprising a thermionic injection FET, a second portion of the stack of nanosheets comprising a tunnel FET (TFET), the stack of nanosheets comprising channel material and sacrificial material.

(2) A FET, as in (1), in which the doping in the source region changes from n-type to p-type (for an n-FET, opposite dopant types for pFET) at a vertical position between the stack of nanosheets comprising a thermionic injection FET and the stack of nanosheets comprising a TFET.

(3) A FET, as in (2), in which the drain region is distinct from the source region, the drain region consisting entirely of an n-doped region (n-FET), or entirely of a p-doped region (p-FET).

(4) A FET, as in (3), in which a common gate electrode wraps around the complete stack of nanosheets comprising the thermionic FET and TFET.

(5) A FET, as in (4), in which the respective threshold voltages, Vt, of the TFET and thermionic FET are different.

(6) A FET, as in (5), in which one set of nanosheets (either thermionic or TFET, or both) includes a moderately doped extended layer, or a delta-doped layer, so as to enable the different Vt between the TFET and thermionic FET.

(7) A FET, as in (4), in which the contact to both the n and p-regions of the source is performed using a single conductive material, such as a metal or silicide. The conductive material can be chosen to reduce or minimize contact resistance of the thermionic FET, allowing for increased resistance to the TFET portion.

(8) A FET, as in (1-7), in which the thermionic FET and TFET channels are formed of Group III-V semiconductor materials, such as InGaAs, InAs, InSb, or InGaSb; the composition of the thermionic FET and TFET channels need not be identical.

(9) A FET, as in (1-7), in which the thermionic FET and TFET channels are formed of Group IV semiconductor materials, such as Si, Ge, or SiGe; the composition of the thermionic FET and TFET channels need not be identical.

(10) A FET, as in (1-7), in which the thermionic FET channels are formed of group IV semiconducting materials, such as Si, Ge, and SiGe, while the TFET channels are formed of Group III-V materials, such as InGaAs, InAs, InSb, InGaSb.

(11) A FET, as in (1-7), in which the TFET channels are formed of group IV semiconducting materials, such as Si, Ge, and SiGe, while the thermionic FET channels are formed of Group III-V materials, such as InGaAs, InAs, InSb, InGaSb.

(12) A FET, as in (8), in which the sacrificial layer between the thermionic FET and TFET channels is comprised of materials including AlSb or GaAs.

(13) A FET, as in (9), in which the sacrificial layer between the thermionic FET and TFET channels is comprised of materials including Si or SiGe.

(14) A FET, as in (1-13), in which a primary conduction mechanism depends on the applied gate bias, VG. The operation of the FET is divided into two regimes: TFET operation for VG<Vt(thermionic), and thermionic FET operation for VG>Vt(thermionic), Vt(thermionic) corresponding to the threshold voltage of the thermionic FET.

(15) A FET, as in (1-14), in which the capacitive loading of the thermionic FET is negligible while operating in the TFET regime.

(16) A FET, as in (1-15), in which the off-state leakage of the TFET and thermionic FET is approximately equal.

(17) A circuit comprised of a thermionic FET and TFET as in (1-16), for which there is no layout area penalty associated with the use of both of a thermionic FET and TFET.

(18) A method of forming a FET, as in (1-16), comprised of a stack of nanosheets further comprising a thermionic FET and tunnel FET, the tunnel FET formed above the thermionic FET, a TFET source of opposite doping type to the thermionic FET source, the source junction, formed due to opposite doping types, shorted by a conductive material, the conductive material such as a metal or silicide primarily chosen for low interface resistance to the source of the thermionic FET.

(19) A method of forming a FET, as in (1-16), comprised of a common gate which wraps around all of the nanosheets comprising a thermionic FET and tunnel FET, the distance of the gate to S/D regions in part determined by the width of formed recessed regions, the recessed regions filled in by low-k dielectric material.

(20) A method of forming a FET, as in (1-16), the etch selectivity between the sacrificial nanosheets and the conduction channel nanosheets, for the thermionic FET or TFET, being >100:1, and in some cases being approximately 1000:1, with the nanosheet being substantially rectangular in cross-section.

(21) A method of forming a FET, as in (5), the different Vt between the thermionic FET and TFET due to formation of an extended, moderately doped layer, or a high-concentration, thin layer ("delta-doping") during epitaxial layer deposition of the stack structure, at a position in the stack structure to result in the desired Vt difference.

(22) A method of forming a FET, as in (5), the different Vt between the thermionic FET and TFET due to different vertical spacing between nanosheets for the thermionic FET and TFET, the different vertical spacing resulting in different gate stack fill between the channel conduction nanosheets, the different gate stack fill causing a Vt difference.

(23) A method of forming a FET, as in (1-16), the epitaxial deposition thickness of the nanosheets for the TFET being less than the epitaxial deposition thickness for the thermionic FET, the epitaxial deposition thickness dependent on deposition variables including e.g. deposition time.

(24) A FET, as in (1), with the first portion and second portion of the stack of nanosheets aligned in a common vertical stack of nanosheets, such that the horizontal layout area projected on the substrate is the same for the thermionic FET and TFET.

(25) A circuit comprised of the combined TFET/Thermionic FET devices as in (1-16), in which the VDD-frequency operating points are chosen so as to maximize the use of the TFET mode.

(26) A FET, as in (1-16), in which the thickness of the TFET nanosheet(s) is chosen to be sufficiently thin to suppress drain-side BTBT, even at VDD levels used for thermionic operation; the thickness of the TFET nanosheet(s) chosen to have sufficiently increased bandgaps due to quantization effects.

(27) A FET, comprised of two FETs each with S and D and Gate, the two FETs aligned in a common vertical stack, the S of each FET connected to each other by a substantially vertical conductive layer, the D of each FET connected to each other by a substantially vertical conductive layer, the Gate of each of the two FETs being a common gate.

(28) A FET, as in (27), and furthermore as in (1-26).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including" are open-ended, and when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

It will also be understood that when an element is referred to as being "on" or "connected" to another element, it can be directly on or connected to the other element, or intervening elements may be present. In contrast, when an element is referred to as being "directly on" or "directly connected" to another element, there are no intervening elements present. In no event, however, should "on" or "directly on" be construed as requiring a layer to completely cover an underlying layer.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the Figures are schematic in nature and their shapes are not intended to illustrate the actual shape of a region of a device and are not intended to limit the scope of the present inventive concept.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures thereon, as would be illustrated by a plan view of the device/structure.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods and systems for providing a hybrid TFET-thermionic FET nanosheet structure have been described. The methods and systems have been described in accordance with the exemplary embodiments shown, and one of ordinary skill in the art will readily recognize that there could be variations to the illustrated embodiments, and any variations would be within the spirit and scope of the method and system. Accordingly, many modifications may be made That which is claimed:

1. A field effect transistor (FET), comprising:
a nanosheet stack comprising first and second semiconductor channel layers that are stacked in a first direction, the first channel layer defining a channel region of a tunnel FET, and the second channel layer defining a channel region of a thermionic FET; and
source and drain regions on opposite sides of the nanosheet stack such that the first and second channel layers extend therebetween, wherein a first portion of the source region directly adjoining the first channel layer and a second portion of the source region directly adjoining the second channel layer have opposite semiconductor conductivity types, wherein a third portion of the source region distal from both the first and second channel layers comprises a p-n junction within the third portion of the source region at an interface between semiconductor portions of the opposite semiconductor conductivity types, wherein the p-n junction is distal from the first and second channel layers in the nanosheet stack and extends in a second direction that is different than the first direction.

2. The transistor of claim 1, wherein the nanosheet stack further comprises respective gate layers on opposing surfaces of the first and second channel layers, and respective gate dielectric layers between the gate layers and the first and second channel layers, wherein the p-n junction does not extend between the respective gate layers.

3. The transistor of claim 2, wherein a threshold voltage of the tunnel FET is less than a threshold voltage of the thermionic FET, and wherein, responsive to application of the threshold voltage of the thermionic FET to the respective gate layers on the opposing surfaces of the first and second channel layers, conduction in the channel region of the thermionic FET is substantially greater than conduction in the channel region of the tunnel FET.

4. The transistor of claim 3, wherein:
the first and second channel layers are both n-channel layers or are both p-channel layers;
the first and second channel layers extend in the second direction, which is perpendicular to the first direction; and
the first and second channel layers comprise different dopant concentrations, different thicknesses, or different dopant concentrations and different thicknesses.

5. The transistor of claim 4, wherein a thickness of the first channel layer is sufficient to prevent band-to-band tunneling in the first channel layer at the drain region at gate voltages greater than the threshold voltage of the thermionic FET.

6. The transistor of claim 5, wherein a thickness of the second channel layer is greater than the thickness of the first channel layer.

7. The transistor of claim 3, wherein the nanosheet stack comprises a plurality of first and second channel layers, wherein respective spacings between the first channel layers of the plurality of first and second channel layers differ from respective spacings between the second channel layers of the plurality of first and second channel layers.

8. The transistor of claim 1, wherein the first and second portions of the source region comprise respective doped extension regions at opposite ends of the first and second channel layers adjacent the source and drain regions and extending between the gate layers.

9. The transistor of claim 8, further comprising:
respective dielectric suspension regions separating ends of the gate layers from the source and drain regions, wherein the doped extension regions laterally extend from the source and drain regions to the first and second channel layers between the gate layers and adjacent the dielectric suspension regions.

10. The transistor of claim 2, further comprising:
respective contacts on the source and drain regions, wherein one of the respective contacts on the source region electrically connects the first and second portions of the source region having the opposite conductivity types to provide an electrical short across the p-n junction.

11. The transistor of claim 1, wherein the first and second channel layers comprise different semiconductor materials or different compositions of a same semiconductor material.

12. The transistor of claim 11, wherein at least one of the first and second channel layers comprises Group III-V semiconductor materials or Group IV semiconductor materials.

13. The transistor of claim 12, wherein the Group III-V semiconductor materials comprise at least one selected from a group consisting of indium gallium arsenide (InGaAs), indium arsenide (InAs), indium antimonide (InSb), and indium gallium antimonide (InGaSb), and wherein the Group IV semiconductor materials comprise silicon (Si), germanium (Ge), and silicon germanium (SiGe).

14. The transistor of claim 2, wherein the first and second channel layers and the source and drain regions comprise epitaxial layers.

15. The transistor of claim 14, wherein the nanosheet stack comprises a heteroepitaxial stack comprising crystalline semiconductor first and second channel layers, crystalline semiconductor gate layers, and crystalline semiconductor or insulating gate dielectric layers, wherein respective interfaces between the first and second channel layers and the gate dielectric layers are free of non-crystalline materials.

16. A method of fabricating a field effect transistor (FET), the method comprising:
providing a nanosheet stack comprising first and second semiconductor channel layers that are stacked in a first direction, the first channel layer defining a channel region of a tunnel FET, and the second channel layer defining a channel region of a thermionic FET; and
forming source and drain regions on opposite sides of the nanosheet stack such that the first and second channel layers extend therebetween,
wherein a first portion of the source region directly adjoining the first channel layer and a second portion of the source region directly adjoining the second channel layer have opposite semiconductor conductivity types, wherein a third portion of the source region distal from both the first and second channel layers comprises a p-n junction within the third portion of the source region at an interface between semiconductor portions of the opposite semiconductor conductivity types, wherein the p-n junction is distal from the first and second channel layers in the nanosheet stack and extends in a second direction that is different than the first direction.

17. The method of claim 16, wherein a threshold voltage of the tunnel FET is less than a threshold voltage of the thermionic FET, and wherein providing the nanosheet stack further comprises:
forming respective gate dielectric layers on opposing surfaces of the first and second channel layers; and forming gate layers on the gate dielectric layers,
wherein the p-n junction does not extend between the gate layers.

18. The method of claim 17, wherein providing the nanosheet stack further comprises:
forming the first and second channel layers comprising different dopant concentrations, different thicknesses, or different dopant concentrations and different thicknesses,
wherein the first and second channel layers are both n-channel layers or are both p-channel layers, and wherein the first and second channel layers extend in the second direction, which is perpendicular to the first direction.

19. The method of claim 18, wherein the first channel layer is formed to a thickness sufficient to prevent band-to-band tunneling therein at the drain region at gate voltages greater than the threshold voltage of the thermionic FET, and wherein the second channel layer is formed to a thickness greater than the thickness of the first channel layer.

20. The method of claim 16, wherein the first and second channel layers and the source and drain regions comprise epitaxial layers.

21. A method of operating a field-effect transistor (FET), the method comprising:
applying a first supply voltage to a gate electrode extending between first and second semiconductor channel layers in a first operating mode, the first and second channel layers being stacked in a first direction and extending between a drain region and a source region, the source region including first and second portions of opposite semiconductor conductivity types directly adjoining the first and second channel layers, respectively, and a third portion distal from both the first and second channel layers that comprises a p-n junction within the third portion of the source region at an interface between semiconductor portions of the opposite semiconductor conductivity types, wherein the p-n junction is distal from the first and second semiconductor channel layers and extends in a second direction that is different than the first direction, and wherein the first supply voltage is sufficient to cause conduction in the first channel layer but is insufficient to cause significant conduction in the second channel layer; and
applying a second supply voltage to the gate electrode in a second operating mode, wherein the second supply voltage is sufficient to cause conduction in the second channel layer that is substantially greater than the conduction in the first channel layer, wherein the first channel layer defines a channel region of a tunnel FET, and wherein the second channel layer defines a channel region of a thermionic FET.

22. The method of claim 21, wherein the first and second channel layers extend in the second direction, which is perpendicular to the first direction, wherein the first and second channel layers are both n-channel layers or are both p-channel layers, and wherein the thermionic FET has a threshold voltage greater than a threshold voltage of the tunnel FET.

23. The method of claim 22, wherein the respective threshold voltages provide a substantially same off-state leakage for the tunnel FET and the thermionic FET in the first and second operating modes, respectively.

24. The method of claim 23, wherein a thickness of the first channel layer is sufficient to prevent band-to-band tunneling in the first channel layer at the drain region responsive to application of the second supply voltage to the gate electrode in the second operating mode.

\* \* \* \* \*